(12) United States Patent
DeSimone et al.

(10) Patent No.: US 9,214,590 B2
(45) Date of Patent: *Dec. 15, 2015

(54) HIGH FIDELITY NANO-STRUCTURES AND ARRAYS FOR PHOTOVOLTAICS AND METHODS OF MAKING THE SAME

(71) Applicant: The University of North Carolina at Chapel Hill, Chapel Hill, NC (US)

(72) Inventors: Joseph M. DeSimone, Chapel Hill, NC (US); Ginger Denison Rothrock, Durham, NC (US); Zhilian Zhou, Chapel Hill, NC (US); Edward T. Samulski, Chapel Hill, NC (US); Meredith Earl, Durham, NC (US); Stuart Williams, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 61 days.

This patent is subject to a terminal disclaimer.

(21) Appl. No.: 13/787,134

(22) Filed: Mar. 6, 2013

(65) Prior Publication Data

US 2013/0249138 A1  Sep. 26, 2013

Related U.S. Application Data

(63) Continuation of application No. 12/299,839, filed as application No. PCT/US2007/011220 on May 29, 2007, now abandoned.

(60) Provisional application No. 60/903,719, filed on Feb. 27, 2007, provisional application No. 60/833,736, (Continued)

(51) Int. Cl.
*B29C 37/00* (2006.01)
*B29C 39/36* (2006.01)
(Continued)

(52) U.S. Cl.
CPC ............ *H01L 31/18* (2013.01); *B29C 37/0003* (2013.01); *B29C 39/36* (2013.01); (Continued)

(58) Field of Classification Search
None
See application file for complete search history.

(56) References Cited

U.S. PATENT DOCUMENTS 5,720,826 A     2/1998  Hayashi et al.
8,263,129 B2 *  9/2012  DeSimone et al. ........... 424/489

(Continued)

FOREIGN PATENT DOCUMENTS

EP      1 696 053 A1   8/2006
JP      2005-183150 A  7/2005
(Continued)

OTHER PUBLICATIONS

Goh, Chiatzun, et al., "Nanostructuring Titania by Embossing with Polymer Molds Made from Anodic Alumina Templates", 2005, Nanoletters, vol. 5, No. 8, pp. 1545-1549.
(Continued)

*Primary Examiner* — Mary F Theisen
(74) *Attorney, Agent, or Firm* — Alston & Bird LLP

(57) ABSTRACT

A photovoltaic device includes an electron accepting material and an electron donating material. One of the electron accepting or donating materials is configured and dimensioned as a first component of a bulk heterojunction with a predetermined array of first structures, each first structure is substantially equivalent in three dimensional shape, has a substantially equivalent cross-sectional dimension, and where each first structure of the array of first structures has a substantially equivalent orientation with respect to adjacent first structures of the predetermined array forming a substantially uniform array.

13 Claims, 27 Drawing Sheets

Related U.S. Application Data filed on Jul. 27, 2006, provisional application No. 60/799,876, filed on May 12, 2006, provisional application No. 60/798,858, filed on May 9, 2006.

(51) Int. Cl.

| | | |
|---|---|---|
| *H01L 31/18* | (2006.01) | |
| *B82Y 10/00* | (2011.01) | |
| *B82Y 20/00* | (2011.01) | |
| *B82Y 30/00* | (2011.01) | |
| *B82Y 40/00* | (2011.01) | |
| *G03F 7/00* | (2006.01) | |
| *H01L 31/0352* | (2006.01) | |
| *H01L 51/00* | (2006.01) | |
| *H01L 51/42* | (2006.01) | |
| *B81C 99/00* | (2010.01) | |
| *B81C 1/00* | (2006.01) | |

(52) U.S. Cl.
CPC ............... *B82Y 10/00* (2013.01); *B82Y 20/00* (2013.01); *B82Y 30/00* (2013.01); *B82Y 40/00* (2013.01); *G03F 7/0002* (2013.01); *H01L 31/0352* (2013.01); *H01L 51/0004* (2013.01); *H01L 51/422* (2013.01); *H01L 51/4253* (2013.01); *B81C 1/00214* (2013.01); *B81C 99/0085* (2013.01); *H01L 51/0036* (2013.01); *H01L 51/0047* (2013.01); *Y02E 10/549* (2013.01)

(56) References Cited

U.S. PATENT DOCUMENTS

| | | |
|---|---|---|
| 2002/0127439 A1 | 9/2002 | Finley et al. |
| 2003/0135971 A1 | 7/2003 | Liberman et al. |
| 2004/0115239 A1 | 6/2004 | Shastri et al. |
| 2004/0115279 A1 | 6/2004 | Hansford et al. |
| 2005/0045874 A1 | 3/2005 | Xiao et al. |
| 2005/0265675 A1 | 12/2005 | Welker et al. |
| 2006/0070653 A1 | 4/2006 | Elrod et al. |
| 2006/0151025 A1 | 7/2006 | Li et al. |

FOREIGN PATENT DOCUMENTS

| | | |
|---|---|---|
| JP | 2006-97125 A | 4/2006 |
| WO | WO 2004/096896 A2 | 11/2004 |
| WO | WO 2005/072235 A2 | 8/2005 |
| WO | WO 2005/101466 A2 | 10/2005 |

OTHER PUBLICATIONS

Khan, Dahl-Young and Lee, Hong H., "Sub-100 nm Patterning with an Amorphous Fuoropolymer Mold", American Chemical Society, 2004, Langmuir, 20, pp. 2445-2448.

Rolland, Jason P. et al., "High-Resolution Soft Lithography: Enabling Materials for Nanotechnologies," 2004, Angew, Chem., pp. 8920-5923.

Song, Lulu, "Study of Ordered Macroporous Polymer Films by Templating Breath Figures", Jan. 2005, Georgia Institute of Technology dissertation, pp. 1-217.

\* cited by examiner

HIGH FIDELITY NANO-STRUCTURES AND ARRAYS FOR PHOTOVOLTAICS AND METHODS OF MAKING THE SAME

CROSS REFERENCE TO RELATED APPLICATIONS

This application is a continuation application of U.S. patent application Ser. No. 12/299,839, filed May 29, 2009, now abandoned, which is a national phase entry of PCT/US2007/11220, filed May 9, 2007, which is based on and claims priority to U.S. Provisional Patent Application Ser. No. 60/798,858, filed May 9, 2006; U.S. Provisional Patent Application Ser. No. 60/799,876, filed May 12, 2006; and U.S. Provisional Patent Application Ser. No. 60/833,736, filed Jul. 27, 2006, and U.S. Provisional Patent Application Ser. No. 60/903,719, filed Feb. 27, 2007; each of which is incorporated herein by reference in its entirety.

U.S. patent application Ser. No. 12/299,839, filed May 29, 2009, now abandoned, is also a continuation-in-part of U.S. patent application Ser. No. 10/583,570, filed Jun. 19, 2006, which is the national phase entry of PCT International Patent Application Ser. No. PCT/US04/42706, filed Dec. 20, 2004, which is based on and claims priority to U.S. Provisional Patent Application Ser. No. 60/531,531, filed on Dec. 19, 2003, U.S. Provisional Patent Application Ser. No. 60/583,170, filed Jun. 25, 2004, and U.S. Provisional Patent Application Ser. No. 60/604,970, filed Aug. 27, 2004; a continuation-in-part of PCT International Patent Application Serial No. PCT/US06/23722, filed Jun. 19, 2006, which is based on and claims priority to U.S. Provisional Patent Application Ser. No. 60/691,607, filed on Jun. 17, 2005, U.S. Provisional Patent Application Ser. No. 60/714,961, filed Sep. 7, 2005, U.S. Provisional Patent Application Ser. No. 60/734,228, filed Nov. 7, 2005, U.S. Provisional Patent Application Ser. No. 60/762,802, filed Jan. 27, 2006, and U.S. Provisional Patent Application Ser. No. 60/799,876 filed May 12, 2006; a continuation-in-part of PCT International Patent Application Serial No. PCT/US06/34997, filed Sep. 7, 2006, which is based on and claims priority to U.S. Provisional Patent Application Ser. No. 60/714,961, filed on Sep. 7, 2005, U.S. Provisional Patent Application Ser. No. 60/734,228, filed Nov. 7, 2005, U.S. Provisional Patent Application Ser. No. 60/762,802, filed Jan. 27, 2006, and U.S. Provisional Patent Application Ser. No. 60/799,876 filed May 12, 2006; and a continuation-in-part of PCT International Patent Application Serial No. PCT/US06/43305 and U.S. patent application Ser. No. 11/594,023, both filed on Nov. 7, 2006; both of which are based on and claim priority to U.S. Provisional Patent Application Ser. No. 60/734,228, filed Nov. 7, 2005, U.S. Provisional Patent Application Ser. No. 60/762,802, filed Jan. 27, 2006, and U.S. Provisional Patent Application No. 60/799,876, filed May 12, 2006; and a continuation-in-part of PCT International Patent Application Serial No. PCT/US2007/002476, filed Jan. 29, 2007, which is based on and claims priority to U.S. Provisional Patent Application Ser. No. 60/762,802, filed Jan. 27, 2006; U.S. Provisional Patent Application Ser. No. 60/798,858, filed May 9, 2006; U.S. Provisional Patent Application Ser. No. 60/799,876, filed May 12, 2006; and U.S. Provisional Patent Application Ser. No. 60/833,736, filed Jul. 27, 2006; each of which is incorporated herein by reference in its entirety.

GOVERNMENT INTEREST

This invention was made with U.S. Government support from Office of Naval Research No. N000140210185 and STC program of the National Science Foundation under Agreement No. CHE-9876674. The U.S. Government has certain rights in the invention.

TECHNICAL FIELD OF THE INVENTION

Generally, the present invention is related to photovoltaic devices and methods for their fabrication. More particularly, the photovoltaic devices are fabricated on a nanostructured scale.

BACKGROUND OF THE INVENTION

Photovoltaics (PV) is the only true portable and renewable source of energy available today. Typically, solar cells generate electricity by converting light energy into electricity through excitons. When light is absorbed an electron is promoted from the highest occupied molecular orbital (HOMO) to the lowest unoccupied molecular orbital (LUMO) forming an exciton. In a PV device, this process must be followed by exciton dissociation to form an electron and a hole. The electron must then reach one electrode while the hole must reach the other electrode in the presence of an electric field in order to achieve charge separation. Generally, the electric field is provided by the asymmetrical ionization energy/work-functions of the electrodes. The materials and the architecture of solar cell devices should enable and facilitate charge separation and migration of the excitons. However, the lifetime of migrating excitons is extremely short and, as such, an exciton can typically diffuse only a short distance, i.e., about 10 nm to about 100 nm, before the electron recombines with the hole it left behind. To separate the electron away from the hole with which it is bound an electron must reach a junction of an electron accepting material, i.e., a material with higher electron affinity, before the electron recombines with the hole it left behind. Thus, the electron accepting material should be positioned within a migration distance of where the electron originated. Because the primary exciton dissociation site is at the electrode interface, this limits the effective light-harvesting thickness of the device and excitons formed in the middle of the organic layer never reach the electrode interface if the layer is too thick. Rather the electrons recombine as described above and the potential energy is lost.

The efficiency of solar cell devices is generally related to the organization or structure, on a nano-scale, of the materials that make up the solar cell. Inexpensive organic solar cells devices have low efficiency because excitons do not dissociate readily in most organic semiconductors. In order to favor exciton dissociation, the concept of heterojuction was proposed, which uses two materials with different electron affinities and ionization potentials. In order to obtain effective light harvesting and exciton dissociation, bulk heterojunction (BHJ) was employed where the distance an exciton must diffuse from its generation to its dissociation site is reduced in an interpenetrating network of the electron donor and acceptor materials. However, although this conceptual framework has been proposed in the art, the lack of control over nanoscale morphology and structure results in random distribution of the donor and acceptor materials that lead to charge trapping in the conducting pathways.

Several methods have been used to make BHJs, such as: control of blend morphology through processing conditions; synthesis of donor-acceptor copolymers; use of porous organic and inorganic films as templates; self organization; and cosublimation of small molecules to from graded donor-acceptor heterostructures. Such methods are described further in: C. J. Brabec, Solar Energy Materials & Solar Cells 83, 273 (2004); H. Spanggaard, F. C. Krebs, Solar Energy Materials & Solar Cells 83, 125 (2004); F. Yang, M. Shtein, S. R. Forrest, Nature Materials 4, 37 (2005); J. Nelson, Current Opinion in Solid State and Materials Science 6, 87 (2002); and N. Karsi, P. Lang, M. Chehimi, M. Delamar, G. Horowitz, Langmuir, 22, 3118 (2006); each of which is incorporated herein by reference in its entirety. However, due to immiscibility of solid state materials, as well as limited synthesis methods and high cost, these methods result in a lack nanoscale morphology and structural control. Furthermore, current methods of PV fabrication that attempt to control nanoscale morphology fail to produce the desired uniform structures and restrict the overall size or footprint of the photovoltaic cell to roughly one square millimeter and cannot be used for large area device fabrication.

Thus, there is a need for solar cells that have deliberate or predetermined nano-scale morphology, can be fabricated from virtually any material, and that can be fabricated in overall dimensions greater than a few square millimeters.

SUMMARY OF THE INVENTION

The present invention includes a high fidelity bulk heterojunction of a photovoltaic device. A component of the bulk heterojunction includes a component configured and dimensioned with a predetermined array of first structures where each first structure of the array of first structures is substantially equivalent in three dimensional shape and where each first structure of the array of first structures has a substantially equivalent cross-sectional dimension, the cross-sectional dimension is less than about 100 nm.

In some embodiments, the photovoltaic device further includes each first structure of the array of first structures having a substantially equivalent orientation with respect to adjacent first structures of the predetermined array forming a substantially uniform array. The three dimensional shape of the first structures of the first component can be a cylinder, a column, a linear structure, or a cone in alternative embodiments. In some embodiments, the photovoltaic device further includes a second component, where the second component has an array of second structures having three dimensional shapes configured and dimensioned to engage the array of predetermined three dimensional shapes of the first structures of the first component.

In alternate embodiments, the photovoltaic device of the present invention includes a photovoltaic cell having a predetermined array of first structures with an overall dimension greater than about one square centimeter, an overall dimension greater than about 2.5 square centimeters, an overall dimension greater than about 5 square centimeters, an overall dimension greater than about 10 square centimeters, an overall dimension greater than about 15 square centimeters, or an overall dimension greater than about 20 square centimeters.

In further alternate embodiments, the cross-sectional dimension of the three dimensional shape of the first structures of the first component is less than about 95 nm, less than about 90 nm, less than about 85 nm, less than about 80 nm, less than about 75 nm, less than about 70 nm, less than about 65 nm, less than about 60 nm, less than about 55 nm, less than about 50 nm, less than about 45 nm, less than about 40 nm, less than about 35 nm, less than about 30 nm, less than about 25 nm, less than about 20 nm, less than about 15 nm, or less than about 10 nm.

In further alternate embodiments, the three dimensional shapes of the second structures of the second component each have a cross-sectional dimension of less than about 100 nm, less than about 90 nm, less than about 80 nm, less than about 70 nm, less than about 60 nm, less than about 50 nm, less than about 40 nm, less than about 30 nm, less than about 20 nm, or less than about 10 nm.

In some embodiments, the first component includes a metal oxide. In some embodiments, the second component is a light absorbing material. In further embodiments, the first component is crystalline, semicrystalline, or amorphous. In still further embodiments, the first component includes a material selected from the group consisting of $TiO_2$, P3HT, PCBM, ITO, and PPV. In some embodiments, the first component is an electron donating material. In other embodiments, a second component of the bulk heterojunction is deposited within interstitial space of the predetermined array of first structures.

According to some embodiments of the present invention, a photovoltaic device includes a first component of a bulk heterojunction configured and dimensioned with a substantially uniform array of first structures fabricated from a mold, where each structure is substantially equivalent in three dimensional shape. In some embodiments, the mold is a fluoropolymer, a PFPE, or a precursor from PFPE.

In some embodiments of the photovoltaic device of the present invention includes a first component configured and dimensioned with a predetermined substantially uniform array of substantially similar three dimensional shaped first structures, where the predetermined substantially uniform array of substantially similar three dimensional shaped first structures is prepared by the process of: molding the predetermined substantially uniform array of substantially similar three dimensional shaped first structures in the fluoropolymer mold.

In some embodiments, a method of forming a photovoltaic device includes: providing a fluoropolymer mold defining an array of substantially equivalently three dimensionally structured cavities, introducing a first material into the substantially equivalently three dimensionally structured cavities of the fluoropolymer mold, hardening the first material in the substantially equivalently three dimensionally structured cavities of the fluoropolymer mold, and removing the hardened first material from the substantially equivalently three dimensionally structured cavities of the fluoropolymer mold.

In some embodiments, the present invention includes a photovoltaic device having an active electron donating component configured and dimensioned with a predetermined substantially uniform array of first structures, where each first structure of the array of first structures is substantially equivalent in three dimensional shape, each first structure of the array of first structures has a substantially equivalent orientation with respect to adjacent first structures of the substantially uniform array and each first structure of the array of first structures has a substantially equivalent cross-sectional dimension.

According to some embodiments a photovoltaic device includes an electron accepting material and an electron donating material that is configured and dimensioned to be positioned near the electron accepting material. Furthermore, at least one of the electron accepting material or electron donating material includes a nano-scale structure fabricated from a template, where the template includes low-surface energy polymeric material.

In other embodiments, a photovoltaic device includes a layer of electron transferring material having a nano-scale feature, where the nano-scale feature is molded from a mold made from a low surface energy polymeric material.

In alternative embodiments, a method of fabricating a photovoltaic device includes providing a mold fabricated from a low surface energy polymeric material, where the mold includes a nano-scale recess configured therein. Next, a first photovoltaic substance is introduced to a surface of the mold such that the first photovoltaic substance enters the nano-scale recess. Then, the first photovoltaic substance is solidified within the recess and the solidified first photovoltaic substance in the recess is coupled to a base layer. Next, the solidified first photovoltaic substance is removed from the recess and a second electron complementary photovoltaic substance is introduced electrically adjacent to the solidified first photovoltaic substance.

According to some embodiments, a method of harvesting nano-particles or nano-structures from molds includes providing a mold fabricated from a low surface energy polymeric material, where the mold includes a nano-scale recess. Introducing a substance into the recess of the mold and solidifying the substance in the recess of the mold to form a nanoparticle. Next, the volume of the recess is decreased such that the nanoparticle is at least partially ejected from the recess.

In other embodiments, a method of harvesting nanoparticles includes contacting particles formed in molds fabricated from a low-surface energy material with PDMS such that the particles adhere to the PDMS more tightly than the particles adhere to the low surface energy material of the mold and removing the PDMS from contact with the low surface energy material mold such that the particles are removed from the mold.

BRIEF DESCRIPTION OF THE DRAWINGS

Reference is made to the accompanying drawings in which are shown illustrative embodiments of the presently disclosed subject matter, from which its novel features and advantages will be apparent.

DETAILED DESCRIPTION OF PREFERRED EMBODIMENTS

Photovoltaic Devices

Figure 1:
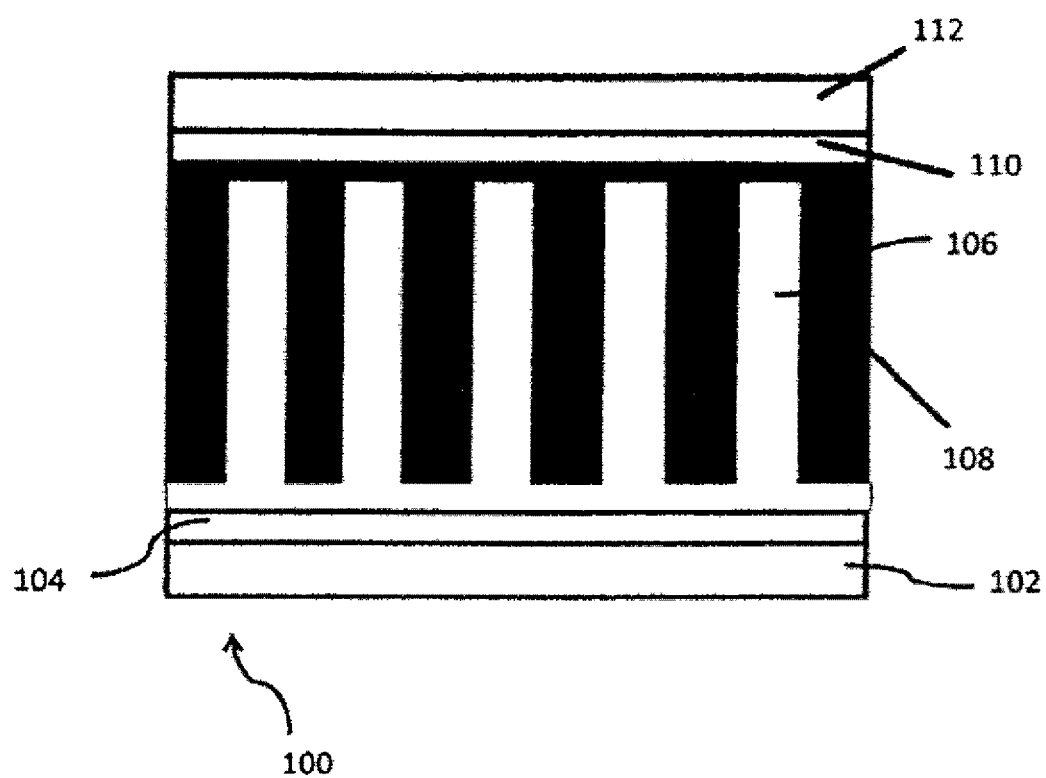
FIG. 1 shows a solar cell fabricated from arrayed nano-scale structures according to an embodiment of the present invention.

According to embodiments of the present invention, nano-scale structures and nano-scale arrays are fabricated from conducting or semiconducting materials to form highly efficient solar cell devices. Structures and arrays of structures are fabricated by molding a material using predetermined nano-scale molds made of low-surface energy polymeric materials. In some embodiments, the predetermined nano-scale arrangement and/or shape of the nano-scale structures have a size between about 1 nm and about 200 nm. In other embodiments, the nano-scale structures have a size between about 1 nm and about 100 nm. In still further embodiments, the nano-scale structures have a size between about 1 nm and about 50 nm. In some embodiments, the nano-scale structures can be arranged into arrays that can be organized symmetrically, in a staggered pattern, offset, or some combination thereof. In some embodiments, the arrays of nano-scale structures can also have a variety of features, sizes, shapes, compositions, or the like assorted within each array, such as for example, some nano-scale structures can be between about 1 nm to about 20 nm is a dimension and other nano-scale structures of the same array can be sized between about 25 nm to about 200 nm in a dimension.

Generally, an organic solar cell device includes an interpenetrating polymer network of an electron donor component (p-type conductor material) and an electron acceptor component (n-type conductor material), which is often referred to as a bulk heterojunction. In some embodiments of the present invention, the electron donor is configured into a predetermined first structured array layer of predetermined high fidelity three dimensional structures. In some embodiments, the electron acceptor material is filled into the inter-spaces between the predetermined three dimensional structures of the first structured array layer. In other embodiments, the electron acceptor is also configured into a predetermined second structured array layer of predetermined high fidelity three dimensional structures. It will be appreciated that either layer or both layers can be configured as the structured layer(s) depending on requirements of a particular application.

In some embodiments, the polymer network can include, but is not limited to, polymer/fullerene blends, halogen-doped organic crystals and solid-state dye-sensitized devices. Conducting polymers can include, for example but not limitation, poly-(phenylenevinylene) (PPV) derivatives or C60 particles. Furthermore, polymer based materials, such as materials disclosed herein can be utilized for other organic electronics such as, for example, Light Emitting Displays (LEDs) and Field Effect Transistors (FETs). Semiconducting polymers, such as described herein and methods for fabricating the same, can be utilized for Light Emitting Displays (LEDs), Field Effect Transistors (FETs), and PV cells. In a polymer photovoltaic device, both active materials can exhibit a high optical absorption coefficient and can cover complementary parts of the solar spectrum. According to some embodiments, polymer based photovoltaic devices of the present invention offer flexible, light weight, larger footprint, high fidelity structures layers, semi-transparency, low-cost fabrication, high-throughput fabrication, low temperature printing techniques, tunable properties of organic materials, and the like to solar cell devices.

According to some embodiments, the nano-scale structures and arrays of structures can be made from, but not limited to, for example, metals, semiconductors, conducting or semiconducting polymers, other materials disclosed herein, combinations thereof, or the like.

Referring now to FIG. 1, an exemplary solar cell photovoltaic device 100 of the present invention is shown. Photovoltaic device 100 may include several components such as: high work function electrode 102, first interfacial layer 104 that can be in contact with high work function electrode 102, first nano-structured arrays of donor material 106 that can include nano-structures 106 and acceptor material 108, second interfacial layer 110 that can be in contact with low work function electrode 112, and low workfunction electrode 112. In some embodiments, a high workfunction electrode 102 can be, but is not limited to, indium tin oxide (ITO) on glass. High workfunction electrode 102 can be modified by, for example, grafting on the surface of the electrode molecules bearing a counter-oriented dipole. In some embodiments, the graft molecule can be, but is not limited to, a short conjugated core equipped with a donor group at one end and an acceptor group at the other end. The molecule can be attached to the electrode surface through a reactive group that may serve as a donor group. The reactive group can be, but is not limited to acids, silanes, thiols, combinations thereof, and the like. The graft molecule can form a self-assembled monolayer (SAM), which can help to attach a patterned, two dimensional array of donor/acceptor materials on to the electrode directly, or to attach an embossed film of two dimensional array of donor/acceptor structures on to the electrode directly. According to some embodiments, high workfunction electrode 102 can be modified so that it facilitates the formation of an array of nano-structures on top of the electrode.

According to some embodiments of the present invention, a first interfacial layer 104 may be fabricated in contact with high workfunction electrode 102. The first interfacial layer 104 can be, but is not limited to an interfacial hole-transporting layer that minimizes indium and oxygen diffusion and smoothes out the uneven high workfunction electrode 102 (ITO) surface, prevents shorts, or allows resistivity in the shunt. The hole-transporting material can be, but is not limited to poly(ethylene dioxythiophene) doped with polystyrene sulfonic acid (PEDOT-PSS). In alternative embodiments, first interfacial layer 104 can be a self-assembled monolayer (SAM). The SAM can be made of, but is not limited to a mixture of fluorinate SAM and reactive SAM to modify a surface of either high workfunction electrode 102 (ITO) or low workfunction electrode 112. The SAM layer can also help to make arrays of donor/acceptor materials with or without a flash or scum layer associated with the nano-scale structured features. According to yet further embodiments, first interfacial layer 104 can be an embossed or molded film that can be made of, but is not limited to an ITO transparent resin made from an incorporation of ITO particles mixed into a polymer resin, for example a Urethane. In another embodiment, first interfacial layer 104 can be a combination of the above described layer.

According to some embodiments of the present invention, second interfacial layer 110 may be fabricated in contact with low workfunction electrode 112. In alternative embodiments, second interfacial layer 110 can be fabricated and then positioned in contact with low workfunction electrode 112. Second interfacial layer 110 can be, but is not limited to the following: an interfacial layer that serves as an exciton blocking and electron-conducting layer, where this layer can be made of, but is not limited to bathocuproine (BCP). In alternative embodiments, second interfacial layer 110 can be a layer or a self-assembled monolayer (SAM), which can be made of, but is not limited to a mixture of fluorinate SAM and reactive SAM to modify the low workfunction electrode 112 surface. This layer can also help to make two dimensional arrays of donor/acceptor materials with or without a flash layer associated with the nano-scale structured features. In another embodiment, second interfacial layer 110 can be a combination of the above described layer.

According to some embodiments of the present invention, low workfunction electrode 112 can be, but is not limited to, Al, Au, Ag, combinations thereof, or the like. Low workfunction electrode 112 can be modified by, but is not limited to, grafting onto the surface molecules bearing a counter-oriented dipole. In some embodiments, the graft molecules can be, but are not limited to, a short conjugated core equipped with a donor group near one end and an acceptor group toward the other end. The molecule can be attached to the electrode surface through a reactive group that may serve as a donor group. The reactive group can be, but is not limited to acids, silanes, thiols, combinations thereof, and the like. The graft molecule can form a self-assembled monolayer (SAM), which can help attach nano-scale pattern arrays of donor/acceptor structures (106, 108) to the electrode directly or to attach a film of an array of donor/acceptor (106, 108) on to the electrode directly. According to some embodiments, low workfunction electrode 112 can be modified so that it facilitates the formation of arrays of nano-particles or nano-structures, such as acceptor material 108, with or without a flash layer on the electrode.

According to some embodiments, the nano-scale structures of the nano-scale array layer (106, 108) can be shaped as, but are not limited to, columns or pillars that are arrayed in a matrix, as shown in FIG. 1. In alternative embodiments, the nano-scale feature arrays (106, 108) can be shaped as, but are not limited to, a sphere, spheroidal, trapezoidal, cylindrical, square, rectangular, cone, pyramidal, amorphous, arrow-shaped, lines or grids, lines of constant thickness, lines of varying thickness, a continuous line, combinations thereof, or the like.

The array shapes can have, in some embodiments, a uniform orientation and regular spacing between the structures. In other embodiments, the array shapes can have alternating shapes, sizes, and orientations, or amorphous shapes, sizes, and orientations, or the like. In other embodiments, the array shapes can vary in height. One preferred embodiment includes a structured component layer having structures designed and oriented in the array to maximize surface area of the structured layer. In some embodiments the distance between nano-scale particle structures is between about 1 nm and about 500 nm. In alternative embodiments, the distance between nano-scale particle structures is between about 1 nm and about 100 nm. In further alternative embodiments, the distance between nano-scale particle structures is between about 5 nm and about 50 nm. In still further embodiments, the distance between nano-scale particle structures is between about 5 nm and about 20 nm. The preferred distance between nano-scale particle structures can be generally determined to be the distance an excited electron will travel before it recombines with its respective hole for a given material that is to be used as donor material 106 and acceptor material 108. Preferably, an interface of electron donating material 106 and electron accepting material 108 of solar cell device 100 will be no further from the furthest electron of electron donating material 106 than the distance the electron can travel when excited by photons. Therefore, an electron that is excited by light energy should be transferred to electron accepting layer 108 and result in useful energy production.

Fabrication of the High Fidelity Photovoltaic Device

The electron donating and electron accepting components of the present invention are structured by nano-scale molding techniques using low-surface energy polymer templates fabricated from methods and materials described in more detail herein and in published PCT patent applications PCT/US06/23722 filed Jun. 17, 2006; PCT/US06/34997 filed Sep. 7, 2006; PCT/US06/31067 filed Aug. 9, 2006, which are incorporated herein by reference. In some embodiments, the molds are fabricated from low-surface energy polymeric materials, such as, but not limited to FLUOROCUR™ (Liquidia Technologies, Inc.), precursors of perfluoropolyether materials, and perfluoropolyether (PFPE) materials described herein. The nano-scale molding techniques of the present invention can begin with, in some embodiments, replicate molding of silicon wafers that have been prepared with a predetermined pattern by, for example, photolithography or etching. The low-surface energy polymeric materials are then introduced to the etched silicon wafer and cured, activated, or hardened to form a replicate mold of the silicon wafer. In alternative embodiments other materials can be used for the molds of the present invention so long as the surface energy of the cured mold materials is less than the surface energies of the materials to be introduced into the mold cavities.

The nano-scale structured layer can have an overall size or footprint that mimics the size of the etched silicon wafer and include nano-scale structure replicates of the etchings of the silicon wafer. Typical silicon wafers have diameters ranging between 2 inch, 4 inch, 6 inch, 8 inch, and 12 inches (50 mm, 100 mm, 150 mm, 200 mm, and 300 mm wafers). Therefore, in some embodiments the overall size or footprint of the structured layer or component (106, 108) can mimic the size of the etched wafer and yield photovoltaic cells ranging in footprint of 2 inch, 4 inch, 6 inch, 8 inch, and 12 inch diameters. However, it should be appreciated that the present invention is not limited to 2, 4, 6, and 8 inch diameter footprints. Rather the photovoltaic cells of the present invention can be fabricated in any size and/or shape that a master template (e.g., silicon wafer, quartz sheet, glass sheet, nickel roll, other patterned surfaces) can be fabricated. In some embodiments, a master template can be fabricated on a continuous process and have lengths and widths that are only limited by practical manufacturing constraints. In some embodiments, the photovoltaic cells can be fabricated in sheets having 4 inch, 6 inch, 8 inch, 12 inch, 24 inch, 36 inch, or 48 inch widths and 4 inch, 6 inch, 8 inch, 12 inch, 24 inch, 36 inch, 48 inch, 60 inch, 72 inch, 84 inch, 96 inch, or continual lengths. Following fabrication, the sheets can be cut into sizes and/or shapes that are required for particular applications. One of ordinary skill in the art will appreciate the range of shapes and/or sizes the nano-structure 106 can be fabricated into.

Making a Photovoltaic Device Using Replication Techniques

Figure 2:
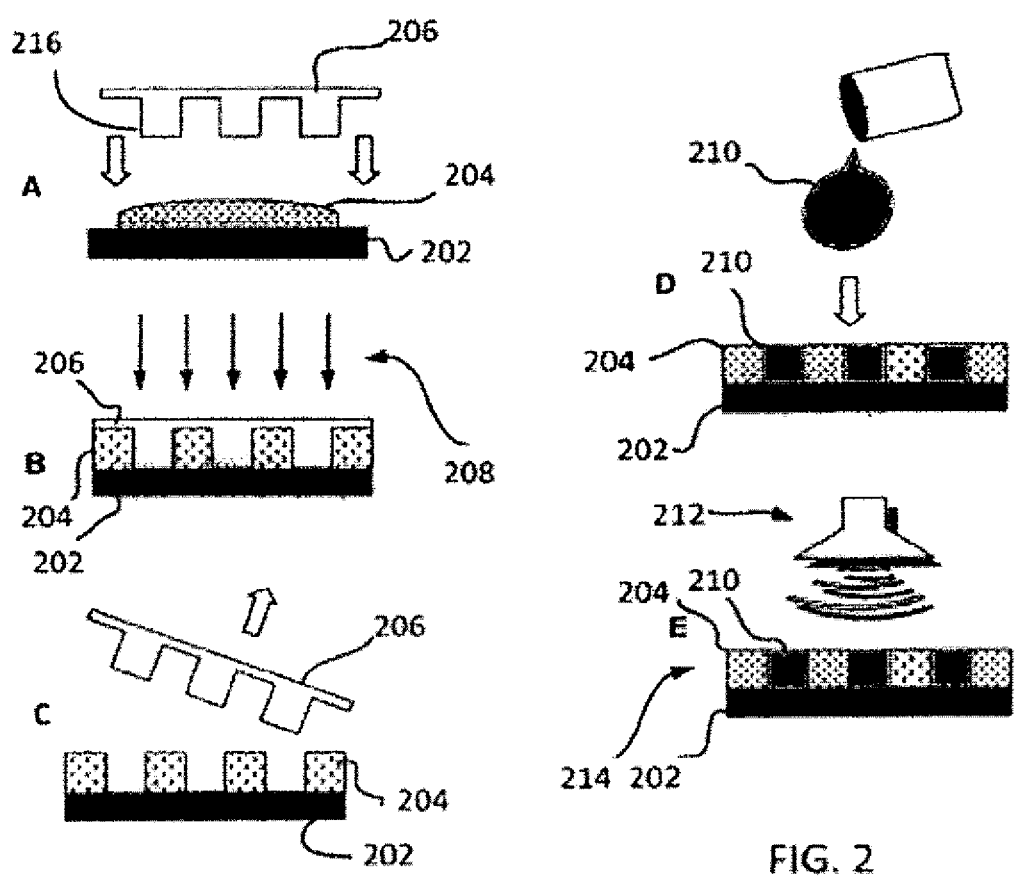
FIG. 2 shows a method of fabricating a photovoltaic device according to an embodiment of the present invention.

Referring now to FIG. 2, a patterned nano-structure can be fabricated according to PRINT™ methods and as disclosed in the above referenced published PCT patent applications. According to FIG. 2, substrate 202 is provided as a backing or base for nano-structure 214. Base 202 can be, for example, an electrically conducting material, a semiconductor, non-conducting material, biocompatible material, dissolvable material, a polymer, a ceramic, a metal, combinations thereof, or the like. First substance 204 is then deposited onto base 202. According to some embodiments, first substance can be an electron donating material or electron accepting material. Preferably, first substance is liquid or can be manipulated into substantially a liquid state for processing; however, first substance does not have to be liquid. Next, patterned template 206, having a pattern thereon, is brought into contact with first substance 204. Patterned template is preferably brought into substantial contact with base 202, thereby displacing first substance 204 where pattern protrusions 216 extend from patterned template 206. As shown in schematic B of FIG. 2, when patterned template 206 is positioned with respect to base 202, first substance is partitioned within patterned recesses of patterned template 206. In alternative embodiments, patterned template 206 can be spaced a distance from base 202, thereby leaving first substance in communication.

According to another embodiment, the liquid, such as first substance 204 in FIG. 2, is located between the template and the substrate by depositing a droplet or plurality of droplets of the liquid on the substrate. Thereafter, contact is made with the liquid by the template to spread the liquid over the surface of the substrate and subsequently record a pattern therein. In other embodiments, the liquid enters the recesses of patterned template by forces generated within the recesses, wherein such forces can include, but are not limited to atmospheric pressure and the like. The droplet can be manually positioned on the substrate or positioned on the substrate by spraying solutions of to-be-modeled liquids on a surface and letting the solvent evaporate to control the amounts deposited.

Next, a treatment 208 is applied to the combination to thereby activate, polymerize, evaporate, solidify or otherwise harden first substance 204 into a solid or semi-solid. Treatment 208 can be any process, such as solvent casting and curing processes and techniques described herein such as, but not limited to, photo-curing, thermal curing, evaporation and combinations thereof. Once treatment process 208 is complete, patterned template 206 is removed from the combination of first substance 204 and base 202.

Next, second substance 210 is introduced to the combination of first substance 204 and base 202 such that second substance 210 fills the wells or recessed patterns left by removal of patterned template 206. Second substance 210 can be any substance, polymer, liquid, semi-solid, paste, electron donating material, electron accepting material, conductor, semiconductor, active, biologic active, drug, antibiotic, combinations thereof, or the like. Second treatment 212 is applied to the combination of first substance 204, base 202, and second substance 210. Second treatment 212 can be any treatment, but particularly treatments disclosed in more detail herein such as, for example, photo-curing, thermal curing, melt processing, evaporation, combinations thereof, and the like. Second treatment 212 initiates and hardens second substance into a solid or semi-solid material and can activate second substance 212 to bind with first substance 204 such that second substance 210 and first substance 204 are chemically and/or physically locked with respect to each other.

According to some embodiments, first substance 204 can be an electron donating material and second substance 210 can be an electron accepting material, such that nano-structure 214 forms a photovoltaic device. Preferably in such a device, any junction of electron donating/electron accepting material would be no further from any electron of electron donating material than between about 1 nm to about 100 nm. More preferably in a photovoltaic device, any junction of electron donating/electron accepting material would be no further from any electron of electron donating material than about 5 nm to about 50 nm. Even more preferably, any junction of electron donating/electron accepting material would be no further from any electron of electron donating material than about 5 nm to about 25 nm.

Figure 3:
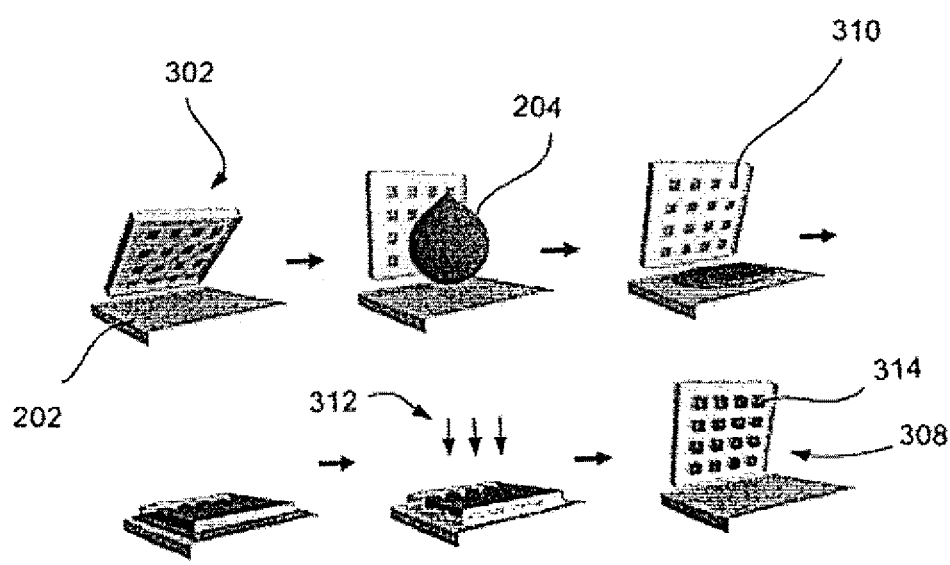
FIG. 3 shows another method of fabricating nano-scale structures according to an embodiment of the present invention.

According to FIG. 3, arrays of discrete predetermined particles or structures 314 can be fabricated by PRINT™ methods. In some embodiments when patterned template 302 is removed, the particles or structures 5014 remain in patterned template 302. According to embodiments, first substance 204, which can be electron donating or accepting material of a photovoltaic device for example, is deposited onto base 202. Patterned template 302 is then positioned to engage first substance 204 such that first substance 204 interacts with the nano-scale recesses 310 of patterned template 302. In alternative embodiment, the first substance 204 can also be deposited into patterned template 302 by vapor deposition, electrospin, combinations thereof, or the like. A treatment 312 is then applied to cure or otherwise solidify or semi-solidify first substance 204 into particles or nano-structures 314 that mimic the shape of the nano-scale recesses 310 of patterned template 302. Treatment 312 can be any treatment disclosed herein, such as for example, photo-curing, thermal curing, evaporation, melt processing, combinations thereof, and the like. Particles or nano-structures 314 are then retained by patterned template 302. In alternative embodiments when the patterned template 302 is removed, the particles or structures 314 remain on the base 202 following fabrication in patterned template 302. According to such methods, base 202 can be a component of the photovoltaic device or particles 314 can be transferred to a film for further transfer to a photovoltaic device, or transferred directly from base 202 to a layer of a photovoltaic device.

Figure 4:
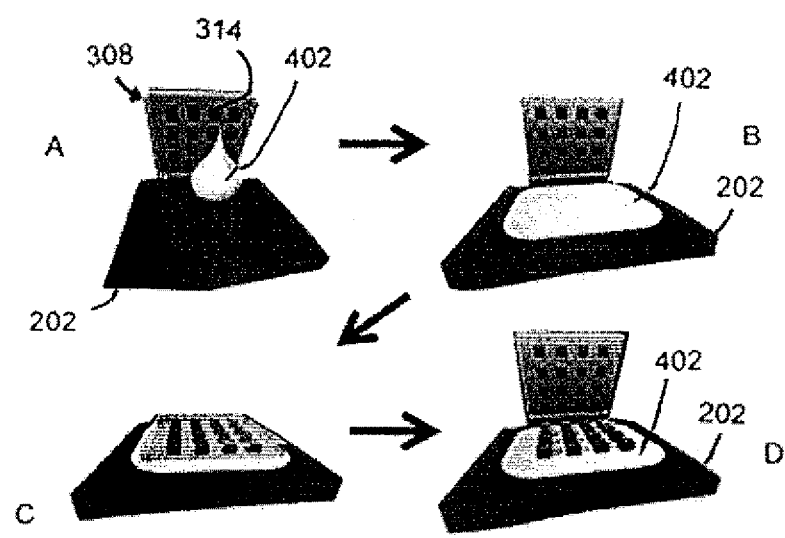
FIG. 4 shows a method for coupling nano-scale structures to a base substance according to an embodiment of the present invention.

Next, to form a photovoltaic device according to embodiments of the present invention, particles or nano-structures 314 of FIG. 3 can be transferred to or coupled with a base substance that is, for example, a high or low workfunction electrode or electron donor or acceptor material. Referring now to FIG. 4, a base substance 402 is positioned onto base 202. The base substance 402 can be but is not limited to an interfacial or SA layer, such as, a fluorinated layer, an adhesive layer, a reactive layer or combinations thereof, and the like. The case can be modified by, but not limited to, grafting on the surface of the electrode molecules bearing a counter-oriented dipole. The graft molecule can be, but not limited to, a short conjugated core equipped with a donor group at one end and an acceptor group at the other end. The molecule is attached to the electrode surface through a reactive group that may serve as a donor group. The reactive group can be, but is limited to acids, silanes, thiols, combinations thereof, and the like. The graft molecule can form a self-assembled monolayer (SAM), which can help, but is not limited to attach a patterned, two dimensional array of donor/acceptor on to the electrode directly. Next, the two-dimensional array of particles 308, retained by patterned template 302, is repositioned into communication with base substance 402 and a treatment is applied to harden, cure, activate, or otherwise solidify base substance 402. The treatment can also be a treatment that results in coupling structures 314 to base substance 402. Structures 314 can be removably coupled to base substance 402, chemically bonded to base substance 402, or the like. In some embodiments, base substance 402 may not require a treatment to be solidified. In some embodiments, structures 314 can form the donor acceptor material and base substance 402 can form the high or low workfunction electrode of a photovoltaic device.

After patterned substance particles 314 are coupled with component layer or base substance 402, a nano-structured component layer for a photovoltaic device is fabricated with nano structures 314 shaped and oriented in deliberate and predetermined placement with respect to adjacent structures 314.

Figure 5:
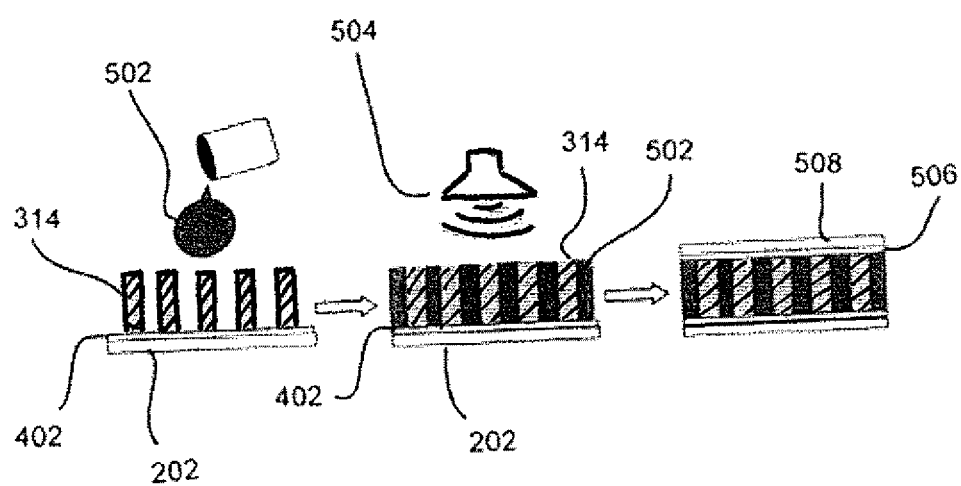
FIG. 5 shows a method of fabricating a photovoltaic device according to an embodiment of the present invention.

In some embodiments as shown in FIG. 5, a second substance 502 is introduced to the combination of particles or nano-structures 314 and base substance 402. Preferably, the composition of second substance 502 is the compliment to the composition of particles 314 in terms of electron donating or electron accepting properties. Therefore, if particles 314 are an electron donating material then second substance 502 can be an electron accepting material. Second substance 502 can be introduced to the combination of particles 314 and base substance 402 such that second substance 502 fills the space that is left open between particles 314 from removal of the patterned template 302. Second substance 502 can be introduced as liquid or substantially liquid, however, second substance 502 does not have to be liquid. Second substance 502 can also be introduced by vapor deposition, electro-spin, melt processing, or other methods. Second substance 502 can be any substance, polymer, liquid, semi-solid, paste, electron donating material, electron accepting material, conductor, semiconductor, active, biologic active, drug, antibiotic, combinations thereof, or the like.

Following introduction of second substance 502 into the space between structures 314, a second treatment 504 can be applied to the combination of particle 314, base substance 402, and second substance 502. Second treatment 504 can be any solvent evaporating process, melt processing, curing treatment, particularly curing treatments disclosed in more detail herein such as, for example, photo-curing, thermal curing, combinations thereof, and the like. Second treatment 504 can initiate and cure second substance 502 into a solid or semi-solid material and can activate second substance 502 to bind with structures 314 or first substance such that second substance 502 and structures 314 are chemically bound or locked with respect to each other. In some embodiment, extra second substance 502 can be introduced so that second substance 502 can be in communication. Extra second substance 502 can also form a second base layer 506 which can be, but is not limited to being an interfacial layer or one of a low or high workfunction electrode layer. According to some embodiments, second substance 502 can be introduced to a first two-dimensional array of nano-scale patterned structures where the structures are extensions protruding from a layer of material. Using similar techniques as described for introducing second substance 502 to the combination of particles 314 and base substance 402, second substance 502 can be introduced into the space between the nano-scale patterned structures, as shown in FIG. 5.

According to some embodiments, first substance 204 or structures 314 can be an electron donating material and second substance 502 can be an electron accepting material, such that the combined nano-structure forms a photovoltaic device. Preferably in such a device, any junction of electron donating/electron accepting material would be no further from any electron of electron donating material than about 1 nm to about 100 nm. More preferably in a photovoltaic device, any junction of electron donating/electron accepting material would be no further from any electron of electron donating material than about 5 nm to about 50 nm. Even more preferably, any junction of electron donating/electron accepting material would be no further from any electron of electron donating material than about 5 nm to about 25 nm. Preferably in such a device, a generated exciton would be no further from a junction of an electron donating/electron accepting material than about 1 nm to about 100 nm. More preferably in a photovoltaic device, a generated exciton would be no further from a junction of an electron donating/electron accepting material than about 5 nm to about 50 nm. Even more preferably, a generated exciton would be no further from a junction of an electron donating/electron accepting material than about 5 nm to about 25 nm. According to an embodiment, each nano-structure 106 has a cross-sectional diameter of less than about 250 nm. According to other embodiments, each nano-structure has a cross-sectional diameter of less than about 225 nm, 200 nm, 175 nm, 150 nm, 140 nm, 130 nm, 120 nm, and 110 nm. According to a more preferred embodiment, each nano-structure 106 has a cross-sectional diameter of less than about 100 nm. According to alternate more preferred embodiments, each nano-structure 106 has a cross-sectional diameter of less than about 95 nm, less than about 90 nm, less than about 85 nm, less than about 80 nm, less than about 75 nm, less than about 70 nm, less than about 65 nm, less than about 60 nm, less than about 55 nm, less than about 50 nm, less than about 45 nm, less than about 40 nm, less than about 35 nm, less than about 30 nm, less than about 25 nm, less than about 20 nm, less than about 15 nm, less than about 10 nm, less than about 7 nm, less than about 5 nm, or less than about 2 nm.

Electron Accepting and Electron Donating Materials

According to some embodiments of the present invention, the electron donating 106 and electron accepting 108 materials of solar cell device 100 can include, but are not limited to, low work-function materials, high work-function materials, electrophilic materials, quantum dots, nanoparticles, microparticles, conjugated polymers, conducting polymers, composite materials, blended materials, electronically-doped materials, nanocomposite materials, electron-transporting materials, hole-transporting materials, light-transmitting materials, nanostructured materials, mesostructured materials, organic materials, conjugated molecules, inorganic materials, nanorods, nanowires, nanocrystals, nanomaterials, carbon nanotubes, $C_{60}$, fullerenes, $C_{60}$ derivatives, $TiO_2$, ITO, TTF CdSe nanoparticles, tin oxide, zinc phthalocyanine, copper phthalocyanine, iron pthalocyanine perylenetetracarboxylic bis-benzimidazole, 3,4,9,10-perylene tetracarboxylic acid, 2,9-dimethyl-antra[2,1,9-def:6,5,10-d'e'f'] dilsoquinoline-1,3,8,10-tetrone, free base phthalocyanine, bathocuproine, poly(3,4-ethylenedioxythiophene):poly(styrenesulfonate), poly(2-methoxy-5-(2'-ethyl-hexyloxy)-1,4-phenylene vinylene), poly(phenylene-vinylene), (2-methoxy-5-(3',7'-dimethyloctyloxy)-1,4-phenylene-vinylene), PCBM=(6,6)-phenyl-C61-butyric acid methyl ester, poly(3-(4'-(1",4",7"-trioxaoctyl)phenyl)thiophene), poly(ethylenedioxythiophene), poly(3-hexylthiophene), poly(3-octylthiophene), poly(3-phenyl-azo-methine-thiophene), polyvinyl (N-carbazole), dicyanovinyl-quaterthiophene, 1,1'-diallyl substituted 4,4'-dipyridine, poly(phenylquinoxaline), 1,4-draminoanthraquinone, poly(1,6-heptadiene), poly(1,4-pyridylvinylene), polyfluorene-containing materials, poly (aniline), selenide nanoparticles, sulfide nanoparticles, telluride nanoparticles, titanium oxide nanoparticles, tungsten oxide nanoparticles, zinc oxide nanoparticles, zirconium oxide nanoparticles, cyanines, merocyanines, phthalocyanines, pyrroles, xanthines, tetrathiafulvalenes, nitrogen-containing materials, sulfur-containing materials, calixarenes, quinones, divalent and trivalent metals, ruthenium transition metal complexes, osmium transition metal complexes, iron transition metal complexes, electrolyte redox system, polymeric electrolytes, photosensitizing agents, silicon nanoparticles, silicon-containing materials, gel electrolytes, exciton blocking layers, combinations thereof, and the like.

One class of solid state materials useful with the present invention is conducting polymers. These polymers typically include organic structures possessing a degree of unsaturation to allow electronic communication throughout a polymeric structure. Because polymers in general are synthesized from monomer components, the design of the conducting properties of a conducting polymer can be facilitated by engineering the monomer component to a desired specificity. Moreover, polymers containing both organic and metal ion components afford a larger number of variables over organic-based polymers through the incorporation of a diverse number of metal ions. A variety of synthetic strategies are described in numerous prior art references, each of which is briefly described below and incorporated herein by reference in its entirety.

Zotti et al. disclosed in situ conductivity of some polypyrroles and polythiophenes redox modified with pendant ferrocene groups. It was found that the electron hopping rate through the conductive polymer backbone is increased by a decrease of the ferrocene backbone distance and by conjugation of ferrocene with the backbone itself. Chem. Mater. 1995, 7, 2309; Cameron at al. describes a benzimidazole-based conjugated polymer with coordinated [Ru(bpy)$_2$]$^{2+}$, moieties, providing direct electronic communication between the ruthenium complex and the polymer. Chem. Commun. 1997 303; Audebert at al. reports a series of conducting polymers based on metal salen containing units based on mononuclear copper$^{II}$, cobalt$^{II}$, nickel$^{II}$ and zinc$^{II}$ complexes. Under carefully chosen conditions, thick electroactive polymer deposits are formed upon electrochemical oxidation of the monomer in solution. New. J. Chem. 1992, 16, 697; Segawa et al. describes a series of highly ordered conducting polymers through the construction of sequentially ordered one- or two-dimensional metalloporphyrin polymers connected by oligothiophene bridges. The one-dimensional phosphorus(V) porphyrin polymers were linked toward the axial direction of the porphyrin ring whereas the two-dimensional metalloporphyrin polymers were linked equatorially by oligibthienyl groups. Both polymer types were prepared by electrochemical polymerization techniques. U.S. Pat. No. 5,549,851 discusses silicon containing polymers admixed with an amine compound. A highly conductive polymer composition is formed upon doping with an oxidizing dopant, typically iodine and ferric chloride. The composition has improved shapability and is easily applicable to form a highly conductive film or coating. U.S. Pat. No. 4,839,112 discloses methods of fabricating low dimensionally electroconductive articles by cofacially stacking organomacrocycles, preferably cofacially stacking phthalocyanines. The cofacially stacked composition in strong Bronsted acid is formed into a desired shape such as a fiber or film. The integration of receptors into conducting polymer frameworks has been shown to produce materials which provide changes in physical characteristics upon binding of targeted analytes; Devynck et al. describes a material containing Co(III) porphyrin sites. Variations in the Co(III)/Co(II) redox couple are observed upon exposure to pyridine and with changing pyridine concentrations. U.S. Pat. No. 5,250,439 reports the use of conductive sensors to determine the presence or concentration of a predetermined analyte in a test sample by measuring the change in conductivity of a layer of an organic conducting polymer. This conductivity change results from generating a dopant compound that migrates to the detection zone of the conductive sensor to dope the layer of conducting polymer. One example describes the dopant compound as including molecular iodine, formed in a reaction between iodide ions, a peroxidase enzyme or a molybdenum(VI) catalyst in the reaction zone of the device to determine the presence or concentration of glucose. U.S. Pat. No. 4,992,244 discloses a chemical microsensor fabricated by using Langmuir-Blodgett techniques. The chemical microsensor is a film based on dithiolene transition metal complexes which display differing degrees of current changes upon exposure to a particular gas or vapor and its concentration. U.S. Pat. No. 6,323,309 to Swager et al. describes conducting polymer transition metal hybrid materials. Materials described by Swager include, but are not limited to, 5-(Tributylstannyl)-2,2-bithiophene; 5,5-Bis(5-bi(2,2'-thienyl))-2,2'-bipyridine; 2-(Tributylstannyl)-3,4-ethylenedioxythiophene; 5,5'-Bis(3,4-ethylenedioxythienyl)-2,2'-bipyridine; 5,5'-Bis(2-(5-bromo-3,4-ethylenedioxythienyl))-2,2'-bipyridine; 5,5'-Bis(5-(2,2'-bi(3,4-ethylenedioxythienyl)-2,2'-bipyridine; Rot(1,Zn)(ClO$_4$)$_2$; Rot(1,Cu)(BF$_4$); Rot(3,Zn)(ClO$_4$)$_2$; Rot(2,Zn)(ClO$_4$)$_2$; Rot (2,Cu)(BF$_4$); 3,4-Ethylenedioxy-2,2'-bithiophene: 2-Tributylstannyl-3,4-ethylenedioxythiophene; 5-(2-Thienyl)salicylaldehyde; 5-(2-(3,4-Ethylenedioxy)thienyl)salicylaldehyde; N,N'-Ethylenebis(5-(2-thienyl)salicylidenimine); N,N'-Ethylenebis(5-(2-(3,4-ethienedioxy)thienyl)salicylidenimine); N,N'-Ethylenebis(5-(2-thienyl)salicylideniminato)cobalt (II); N,N'-Ethylenebis(5-(2-(3,4-ethylenedioxy)thienyl)salicylideniminato)cobalt (II) (6), combinations thereof, and the like.

Figure 6:
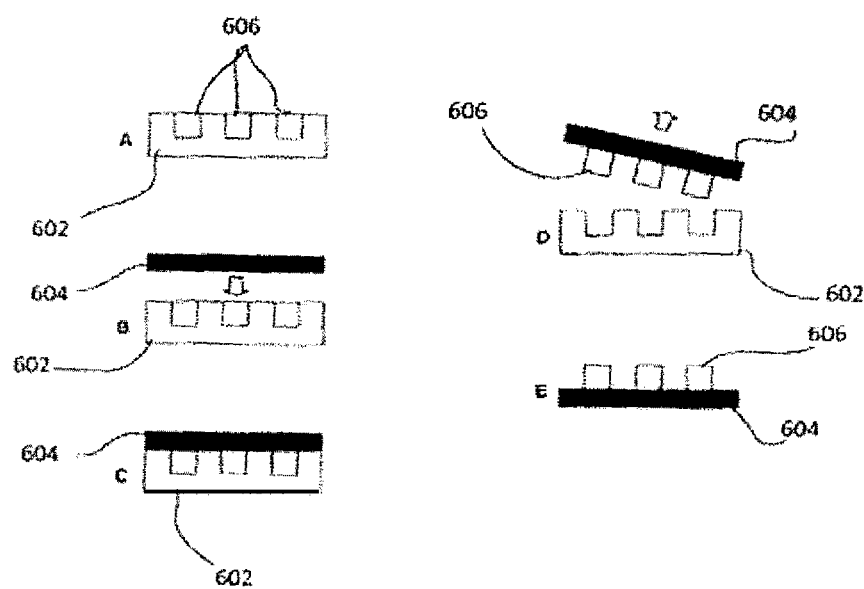
FIG. 6 shows another method of harvesting nano-scale structures according to an embodiment of the present invention.

In embodiments of the present invention where particles or nano-structures are fabricated as individual discrete nano-particles in the patterned templates, the nano-particles often need to be harvested from the cavities of the patterned templates before they can be used or applied to photovoltaic devices. Nano-particle harvesting methods include methods described in the applicants co-pending published PCT patent applications referenced herein. According to some methods, as shown in FIG. 6, discrete nano-particles 606 are fabricated in mold 602 as described herein. Prior to or following treatment for solidifying nano-particles 606, harvesting layer 604 having an affinity for particles 606 is put into contact with particles 606 while particles 606 remain in connection with mold 602. Harvesting layer 604 generally has a higher affinity for particles 606 than the affinity between mold 602 and particles 606. In FIG. 6D, the disassociation of harvesting layer 604 from mold 602 thereby releases particles 606 from mold 602 leaving particles 606 attached to harvesting layer 604.

In one embodiment harvesting layer 604 has an affinity for particles 606. For example, in some embodiments, harvesting layer 604 includes an adhesive or sticky surface when applied to mold 602. In other embodiments, harvesting layer 604 undergoes a transformation after it is brought into contact with mold 602. In some embodiments that transformation is an inherent characteristic of harvesting layer 604. In other embodiments, harvesting layer 604 is treated to induce the transformation. For example, in one embodiment harvesting layer 604 is an epoxy that hardens after it is brought into contact with mold 602. Thus when mold 602 is pealed away from the hardened epoxy, particles 606 remain engaged with the epoxy and not mold 602. In other embodiments, harvesting layer 604 is water that is cooled to form ice. Thus, when mold 602 is stripped from the ice, particles 606 remain in communication with the ice and not mold 602. In one embodiment, the particle-containing ice can be melted to create a liquid with a concentration of particles 606. In some embodiments, harvesting layer 604 includes, without limitation, one or more of a carbohydrate, an epoxy, a wax, polyvinyl alcohol, polyvinyl pyrrolidone, polybutyl acrylate, a polycyano acrylate and polymethyl methacrylate. In some embodiments, harvesting layer 604 includes, without limitation, one or more of liquids, solutions, powders, granulated materials, semi-solid materials, suspensions, combinations thereof, or the like.

Particles or nano-scale structures can be harvested from the patterned template 602 by kinetic transfer, such as adhesion to a PDMS layer as shown in FIG. 6. A layer of PDMS 604 is pressed slowly against the patterned template mold 602 containing particles 606, then the PDMS layer 604 is quickly removed. The PDMS layer 604, adheres to the particles and removes them from mold 602.

According to yet another embodiment the particles and/or patterned array structure are harvested on a fast dissolving substrate, sheet, or films. The film-forming agents can include, but are not limited to pullulan, hydroxypropylmethyl cellulose, hydroxyethyl cellulose, hydroxypropyl cellulose, polyvinyl pyrrolidone, carboxymethyl cellulose, polyvinyl alcohol, sodium alginate, polyethylene glycol, xanthan gum, tragacanth gum, guar gum, acacia gum, arabic gum, polyacrylic acid, methylmethacrylate copolymer, carboxyvinyl polymer, amylose, high amylose starch, hydroxypropylated high amylose starch, dextrin, pectin, chitin, chitosan, levan, elsinan, collagen, gelatin, zein, gluten, soy protein isolate, whey protein isolate, casein, combinations thereof, and the like.

In some embodiments, the method includes harvesting or collecting the particles. In some embodiments, the harvesting or collecting of the particles includes a process selected from the group including scraping with a doctor blade, a brushing process, a dissolution process, an ultrasound process, a megasonics process, an electrostatic process, and a magnetic process. In some embodiments, the harvesting or collecting of the particles includes applying a material to at least a portion of a surface of the particle wherein the material has an affinity for the particles. In some embodiments, the material includes an adhesive or sticky surface. In some embodiments, the material includes, without limitation, one or more of a carbohydrate, an epoxy, a wax, polyvinyl alcohol, polyvinyl pyrrolidone, polybutyl acrylate, a polycyano acrylate, a polyacrylic acid and polymethyl methacrylate. In some embodiments, the harvesting or collecting of the particles includes cooling water to form ice (e.g., in contact with the particles). In some embodiments, the presently disclosed subject matter describes a particle or plurality of particles formed by the methods described herein. In some embodiments, the plurality of particles includes a plurality of monodisperse particles. In some embodiments, the particle or plurality of particles is selected from the group including a semiconductor device, a crystal, a drug delivery vector, a gene delivery vector, a disease detecting device, a disease locating device, a photovoltaic device, a porogen, a cosmetic, an electret, an additive, a catalyst, a sensor, a detoxifying agent, an abrasive, such as a CMP, a micro-electro-mechanical system (MEMS), a cellular scaffold, a taggant, a pharmaceutical agent, and a biomarker. In some embodiments, the particle or plurality of particles include a freestanding structure.

Micro and Nano Structures and Particles

Figure 7:
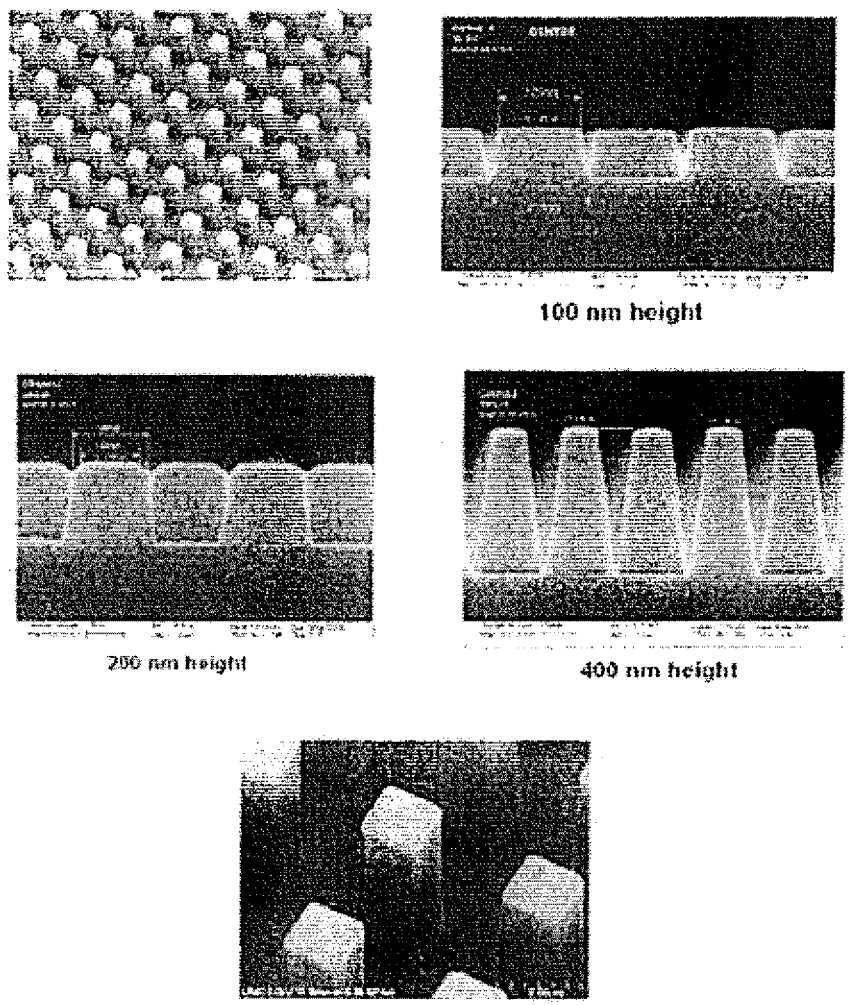
FIG. 7 shows cross-sectional views of master templates and nano-structured array polymers fabricated according to embodiments of the present invention.
Figure 25:
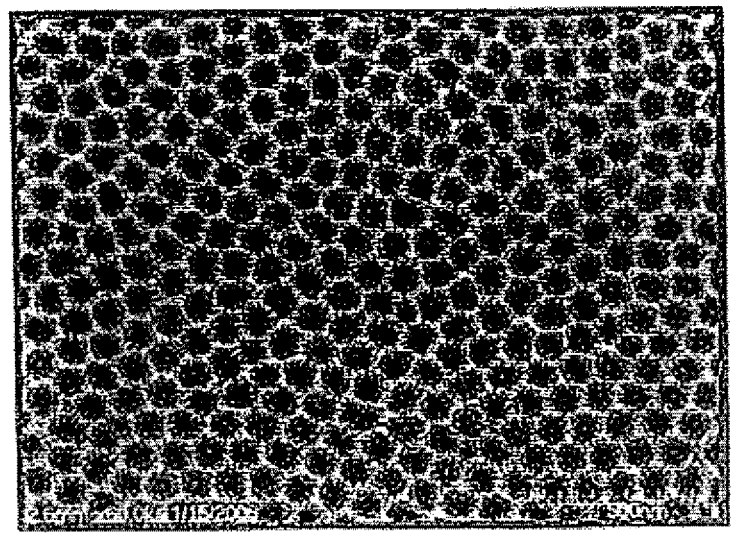
FIG. 25 shows a $TiO_2$ replica with features less than about 50 nm replicated from a pAAO template according to an embodiment of the present invention.
Figure 26A:
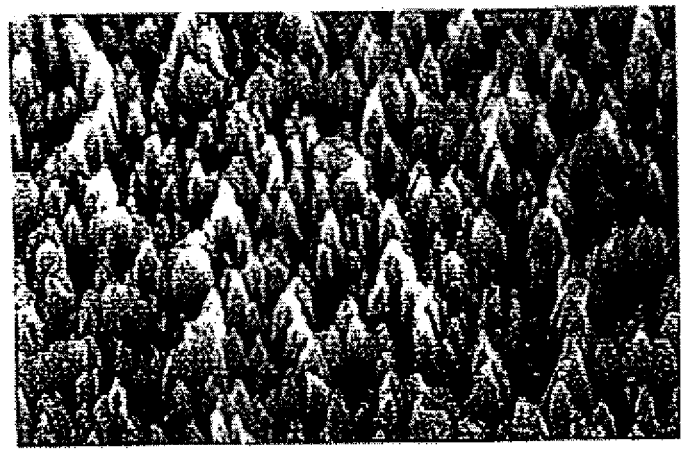
FIG. 26A shows a master template having sub-50 nm structures and FIG. 26B shows a $TiO_2$ replicate of the master template of FIG. 26A where the master and template have sub-50 nm structures according to an embodiment of the present invention.
Figure 26B:
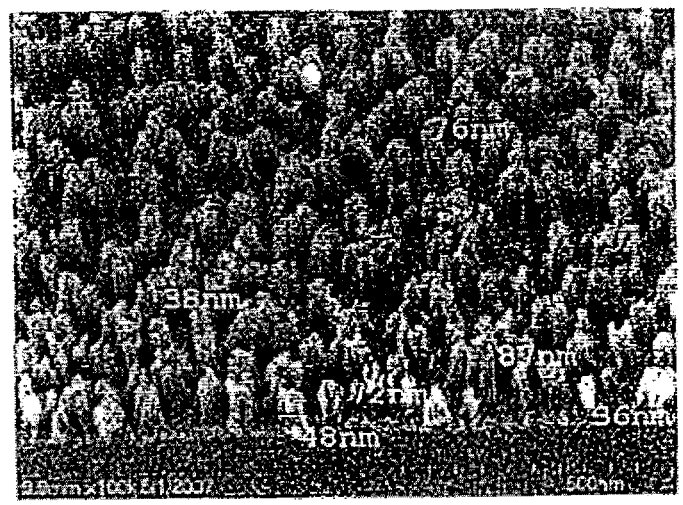

According to some embodiments, a structure, structured layer, or particle formed according to disclosed methods and techniques herein can have a shape corresponding to a mold of a desired shape and geometry. According to other embodiments, nano-particles or nano-structures of many predetermined regular and predetermined irregular shape and size configurations and patterned arrays can be made with the materials and methods of the presently disclosed subject matter. Examples of representative particle and/or array structure shapes that can be made using the materials and methods of the presently disclosed subject matter include, but are not limited to, non-spherical, spherical, viral shaped, bacteria shaped, cell shaped, rod shaped (e.g., where the rod is less than about 200 nm in diameter), chiral shaped, right triangle shaped, flat shaped (e.g., with a thickness of about 2 nm, disc shaped with a thickness of greater than about 2 nm, or the like), boomerang shaped, combinations thereof, and the like. Referring now to FIG. 7, cross-section SEM images of master templates are shown in sizes 100 nm, 200 nm, and 400 nm heights. Also shown in FIG. 7 are replicate structure arrays molded from alternative masters showing high fidelity predetermined structure size, shape, and arrangement obtained according to materials and methods of the present invention. Structures replicate molded with structure sizes less than 50 nm are shown in FIGS. 25 and 26. According to FIGS. 25 and 26, $TiO_2$ materials of the present invention are shown replicate molded with structures having high fidelity and predetermined shape, size, and orientation, according to embodiments of the present invention.

Materials from Which Structures and/or Arrays of Structures are Formed

In some embodiments, the material from which the particles are formed includes, without limitation, one or more of a polymer, a liquid polymer, a solution, a monomer, a plurality of monomers, a polymerization initiator, a polymerization catalyst, an inorganic precursor, an organic material, an electron donating material, an electron accepting material, photovoltaic materials, a natural product, a metal precursor, a magnetic material, a paramagnetic material, superparamagnetic material, a charged species, combinations thereof, or the like.

Representative superparamagnetic or paramagnetic materials include but are not limited to $Fe_2O_3$, $Fe_3O_4$, FePt, Co, $MnFe_2O_4$, $CoFe_2O_4$, $CuFe_2O_4$, $NiFe_2O_4$ and ZnS doped with Mn for magneto-optical applications, CdSe for optical applications, and borates for boron neutron capture treatment. In some embodiments, the liquid material is selected from one of a resist polymer and a low-k dielectric. In some embodiments, the liquid material includes a non-wetting agent.

In some embodiments, the monomer includes butadienes, styrenes, propene, acrylates, methacrylates, vinyl ketones, vinyl esters, vinyl acetates, vinyl chlorides, vinyl fluorides, vinyl ethers, acrylonitrile, methacrylnitrile, acrylamide, methacrylamide allyl acetates, fumarates, maleates, ethylenes, propylenes, tetrafluoroethylene, ethers, isobutylene, fumaronitrile, vinyl alcohols, acrylic acids, amides, carbohydrates, esters, urethanes, siloxanes, formaldehyde, phenol, urea, melamine, isoprene, isocyanates, epoxides, bisphenol A, alcohols, chlorosilanes, dihalides, dienes, alkyl olefins, ketones, aldehydes, vinylidene chloride, anhydrides, saccharide, acetylenes, naphthalenes, pyridines, lactams, lactones, acetals, thiiranes, episulfide, peptides, derivatives thereof, and combinations thereof.

In yet other embodiments, the polymer includes polyamides, proteins, polyesters, polystyrene, polyethers, polyketones, polysulfones, polyurethanes, polysiloxanes, polysilanes, cellulose, amylose, polyacetals, polyethylene, glycols, poly(acrylate)s, poly(methacrylate)s, poly(vinyl alcohol), poly(vinylidene chloride), poly(vinyl acetate), poly(ethylene glycol), polystyrene, polyisoprene, polyisobutylenes, poly (vinyl chloride), poly(propylene), poly(lactic acid), polyisocyanates, polycarbonates, alkyds, phenolics, epoxy resins, polysulfides, polyimides, liquid crystal polymers, heterocyclic polymers, polypeptides, conducting polymers including polyacetylene, polyquinoline, polyaniline, polypyrrole, polythiophene, and poly(p-phenylene), dendimers, fluoropolymers, derivatives thereof, combinations thereof.

In still further embodiments, the material from which the particles are formed includes a non-wetting agent. According to another embodiment, the material is a liquid material in a single phase. In other embodiments, the liquid material includes a plurality of phases. In some embodiments, the liquid material includes, without limitation, one or more of multiple liquids, multiple immiscible liquids, surfactants, dispersions, emulsions, micro-emulsions, micelles, particulates, colloids, porogens, active ingredients, combinations thereof, or the like.

In some embodiments, additional components are included with the material of the nano-scale particle or structures to functionalize the particle. According to these embodiments the additional components can be encased within the isolated structures, partially encased within the isolated structures, on the exterior surface of the isolated structures, combinations thereof, or the like. Additional components can include, but are not limited to, electron accepting materials, electron donating materials, electrically conductive materials, biologic materials, metals, semiconducting materials, insulating materials, combinations thereof, and the like.

Formation of Multilayer Structures

The present invention includes methods for forming multilayer structures, including multilayer nano-particles, multilayer electron accepting and/or donating materials, multilayer photovoltaic structures, and the like. In some embodiments, multilayer structures are formed by depositing multiple thin layers of immisible liquids and/or solutions onto a substrate and forming nano-particles or nano-structures as described by any of the methods herein. The immiscibility of the liquid can be based on any physical characteristic, including but not limited to density, polarity, volatility, and combinations thereof. Examples of possible morphologies include, but are not limited to, multi-phase sandwich structures, core-shell particles, internal emulsions, microemulsions and/or nano-sized emulsions, combinations thereof, and the like.

More particularly, in some embodiments, the method includes disposing a plurality of immiscible liquids between the patterned template and substrate to form a multilayer structure, e.g., a multilayer nanostructure. In some embodiments, the multilayer structures are multilayer discrete predetermined nano-particles or nano-structures. In some embodiments, the multilayer structure includes a structure selected from the group including multi-phase sandwich structures, core-shell particles, internal emulsions, microemulsions, and nanosized emulsions.

According to some embodiments, particles or nano-scale array structures fabricated from the materials and methods of the present invention can be delivered straight to a formulation or composite final product rather than initially collecting the particles. According to such methods, following processes of the present invention for fabricating particles, the particles are generally in an addressable 2-D array and physically separated. While the particles are generally uniformly separated directly upon removal from the patterned template, the particles can be directly incorporated into a final product to reduce agglomeration issue in a photovoltaic device.

Each reference cited herein is hereby incorporated by reference in its entirety, including each reference cited therein.

EXAMPLES

Example 1

Fabrication of a Generic Polymer-Polymer BHJ PV Cell

A patterned perfluoropolyether (PFPE) mold can be generated by pouring a PFPE-dimethacrylate (PFPE-DMA) containing 1-hydroxycyclohexyl phenyl ketone over a silicon substrate patterned with 140 nm lines separated by 70 nm. A poly(dimethylsiloxane) mold can be used to confine the liquid PFPE-DMA to the desired area.

The apparatus can then be subjected to UV light ($\lambda$=365 nm) for 10 minutes while under a nitrogen purge. Next, the fully cured PFPE-DMA mold is released from the silicon master. Separately, an ITO glass substrate will be pre-treated with acetone and isopropanol in an ultrasonic bath followed by cleaning for 10 minutes with oxygen plasma. The ITO substrate will be then treated with a non-wetting silane agent and an adhesion promoter. Following this, the electron donor material will be blended with a photoinitiator, a sample placed on the treated ITO substrate, and the patterned PFPE mold placed on top of it. The substrate will then be placed in a molding apparatus and a small pressure applied to ensure conformal contact and to push out excess donor material. The entire apparatus will then be subjected to UV light while under a nitrogen purge. Next, the PFPE mold can be separated from the treated ITO substrate. A solution of the electron acceptor material can then be spin coated onto the electron donor material followed by deposition of a metal cathode onto the electron acceptor material.

It is desirable that the electron donor material is either photo or thermal curable. It is also desirable that the electron acceptor material can be spin coated as a solution onto the donor features where the solvent used does not dissolve or swell the electron donor material.

Example 2

Fabrication of PV Cell Using OVPD to Obtain Nanostructured BHJ's

A patterned perfluoropolyether (PFPE) mold can be generated by pouring a PFPE-dimethacrylate (PFPE-DMA) containing 1-hydroxycyclohexyl phenyl ketone over a silicon substrate patterned with 140 nm lines separated by 70 nm. A poly(dimethylsiloxane) mold can be used to confine the liquid PFPE-DMA to the desired area.

The apparatus will then be subjected to UV light ($\lambda$=365 nm) for 10 minutes while under a nitrogen purge. Next, the fully cured PFPE-DMA mold is released from the silicon master. Separately, an ITO glass substrate will be pre-treated with acetone and isopropanol in an ultrasonic bath followed by cleaning for 10 minutes with oxygen plasma. Using organic vapor-phase deposition (OVPD), copper phthalocyanine (CuPc) can be deposited onto the PFPE mold so that the features are filled and a uniform layer of CuPc connects each feature. The ITO substrate can then be treated with an adhesion promoter and the embossed film will be transferred from the mold onto the substrate. Next, 3,4,9,10-perlenetetracarboxylic bis-benzimidazole (PTCBI) will be deposited onto the CuPc features using OVPD. Note: both depositions are performed under an inert atmosphere. A 100-A-thick exciton blocking and electron-conducting layer of bathocuproine (BCP) and a 1,000-A-thick silver cathode are then grown by conventional vacuum thermal evaporation to complete the photovoltaic cell.

Example 3

Fabrication of 200 nm Europium-Doped Titania Structures for Microelectronics

A patterned perfluoropolyether (PFPE) mold is generated by pouring a PFPE-dimethacrylate (PFPE-DMA) containing 1-hydroxycyclohexyl phenyl ketone over a silicon substrate patterned with 140 nm lines separated by 70 nm. A poly (dimethylsiloxane) mold is used to confine the liquid PFPE-DMA to the=365 nm) for 10 desired area. The apparatus is then subjected to UV light ($\lambda$ minutes while under a nitrogen purge. The fully cured PFPE-DMA mold is then released from the silicon master. Separately, 1 g of Pluronic P123 and 0.519 of EuCl3.6H2O are dissolved in 12 g of absolute ethanol. This solution was added to a solution of 2.7 mL of concentrated hydrochloric acid and 3.88 mL titanium (IV) ethoxide. Flat, uniform, surfaces are generated by treating a silicon/silicon oxide wafer with "piranha" solution (1:1 concentrated sulfuric acid: 30% hydrogen peroxide (aq) solution) and drying. Following this, 50 µL of the sol-gel solution is then placed on the treated silicon wafer and the patterned PFPE mold placed on top of it. The substrate is then placed in a molding apparatus and a small pressure is applied to push out excess sol-gel precursor. The entire apparatus is then set aside until the sol-gel precursor has solidified. Oxide structures are observed after separation of the PFPE mold and the treated silicon wafer using scanning electron microscopy (SEM).

Example 4

Fabrication of Isolated "Flash Free" Features for Microelectronics

A patterned perfluoropolyether (PFPE) mold is generated by pouring a PFPE-dimethacrylate (PFPE-DMA) containing 1-hydroxycyclohexyl phenyl ketone over a silicon substrate patterned with 140 nm lines separated by 70 nm. A poly (dimethylsiloxane) mold is used to confine the liquid PFPE-DMA to=365 nm) for the desired area. The apparatus is then subjected to UV light (λ 10 minutes while under a nitrogen purge. The fully cured PFPE-DMA mold is then released from the silicon master. Separately, TMPTA is blended with 1 wt % of a photoinitiator, 1-hydroxycyclohexyl phenyl ketone. Flat, uniform, non-wetting surfaces capable of adhering to the resist material are generated by treating a silicon wafer cleaned with "piranha" solution (1:1 concentrated sulfuric acid: 30% hydrogen peroxide (aq) solution) and treating the wafer with a mixture of an adhesion promoter, (trimethoxysilyl propyl methacryalte) and a non-wetting silane agent (1H, 1H, 2H, 2H-perfluorooctyl trimethoxysilane). The mixture can range from 100% of the adhesion promoter to 100% of the non-wetting silane. Following this, 50 µL of TMPTA is then placed on the treated silicon wafer and the patterned PFPE mold placed on top of it. The substrate is then placed in a molding apparatus and a small pressure is applied to ensure a conformal contact and to push out excess TMPTA. The entire apparatus is then subjected to UV=365 nm) for ten minutes while under a nitrogen purge. Features are light (λ observed after separation of the PFPE mold and the treated silicon wafer using atomic force microscopy (AFM) and scanning electron microscopy (SEM).

Example 5

Figure 8:
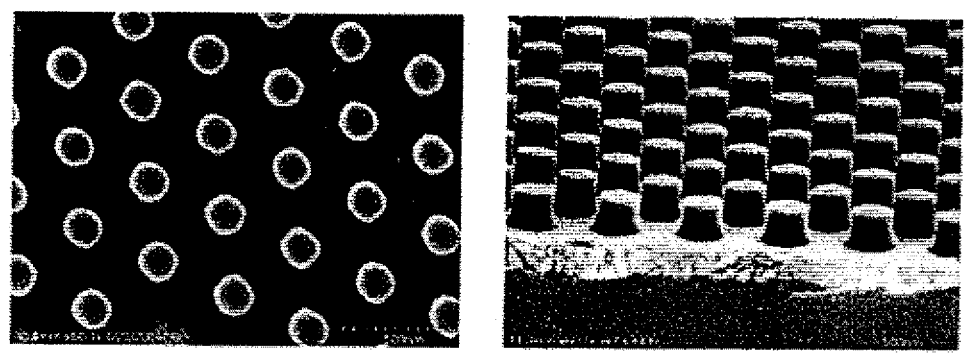
FIG. 8 shows SEM images at different magnifications of patterned $TiO_2$ xerogel after 110° C. heat treatment according to an embodiment of the present invention.

The sol precursor of $TiO_2$ was prepared by the following procedure. A round bottom (RB) flask equipped with a stir bar was dried at 110 C oven before use. The RB was capped with a rubber septum and purged with nitrogen. Titanium n-butoxide (5 mL) was added to the RB under nitrogen flow. Acetylacetone (3.5 mL) was added dropwise to the reaction flask, followed by the addition of isopropanol (4 mL). Acetic acid (0.12 mL) was added dropwise under nitrogen atmosphere to form a clean yellow mixture. The sol precursor was stirred at room temperature for 3 hr before use. To make patterned $TiO_2$, an aliquot of the sol precursor was added onto a ITO or FTO coated substrate. A piece of FLUOROCUR™ mold with 200 nm by 200 nm features was put on top of the sol solution. The apparatus was put in a vice under pressure and kept at 110° C. oven for 3 hr. After cooling down, the $TiO_2$ precursor had been converted to a xerogel and the FLUOROCUR™ mold was removed from the substrate. FIG. 8 shows the SEM image of patterned $TiO_2$ xerogel prepared by this process. To convert $TiO_2$ to the anatase form, the ITO/FTO substrate with patterned $TiO_2$ xerogel was heated to 450° C. at a heating rate of 4° C./min and kept at 450° C. for 1 hr.

Figure 9:
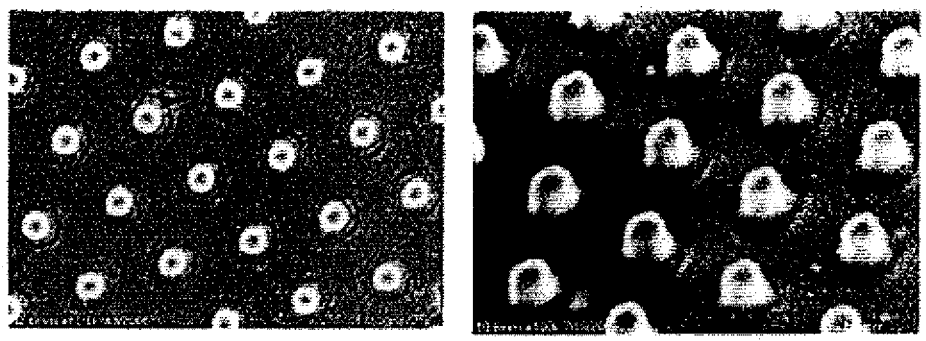
FIG. 9 shows SEM images of patterned $TiO_2$ (anatase form) at different magnifications after calcination at 450° C. according to an embodiment of the present invention.

The crystalline form of the calcinated $TiO_2$ was confirmed by XRD. FIG. 9 shows an SEM image of the patterned $TiO_2$ in the anatase form after calcination.

Example 6

Figure 10:
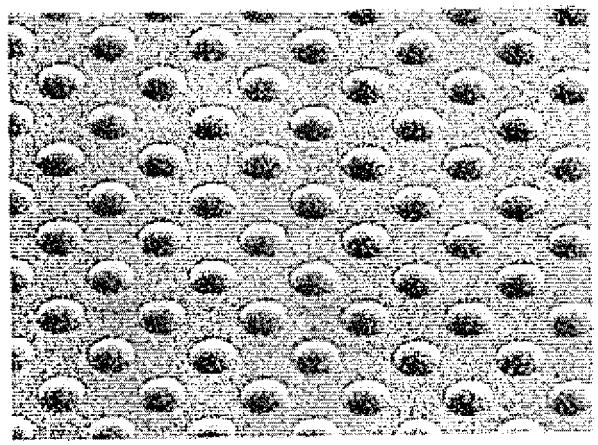
FIG. 10 shows an SEM image of ZnO xerogel after 100° C. heat treatment according to an embodiment of the present invention.

The sol precursor of ZnO was prepared by the following procedure. In a vial, mix 7.19 mL 2-methoxyethanol and 0.27 mL mono ethanol amine and stir the mixture to form a colorless solution. Add 1 g zinc acetate dihydrate to the solution mixture and stir at room temperature for 1 hr or until a homogeneous solution was formed. To make patterned ZnO, an aliquot of the sol precursor was added onto a glass substrate. A piece of FLUOROCUR™ mold with 2 micron features was put on top of the sol solution. The apparatus was put in a vice under pressure and kept at 100° C. oven for 2 hr. After cooling down, the ZnO precursor had been converted to a xerogel and the FLUOROCUR™ mold was removed from the substrate. FIG. 10 shows the SEM image of patterned ZnO xerogel prepared by this process. To convert ZnO to the crystalline form, the glass substrate with patterned ZnO xerogel was heated to 500° C. at a heating rate of 10° C./min and kept at 500° C. for 1 hr. The crystalline form of the calcinated ZnO was confirmed by XRD.

Example 7

Figure 11:
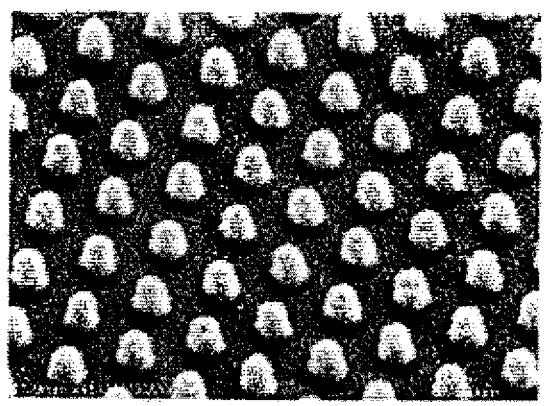
FIG. 11 shows an SEM image of patterned ZnO after calcinations according to an embodiment of the present invention.

The sol precursor of ZnO was prepared by the following procedure. In a vial, mix 7.19 mL 2-methoxyethanol and 0.27 mL mono ethanol amine and stir the mixture to form a colorless solution. Add 1 g zinc acetate dihydrate to the solution mixture and stir at room temperature for 1 hr or until a homogeneous solution was formed. To make patterned ZnO, an aliquot of the sol precursor was added onto a glass substrate. A piece of FLUOROCUR™ mold with 200 nm by 200 nm features was put on top of the sol solution. The apparatus was put in a vice under pressure and kept at 100° C. oven for 2 hr. After cooling down, the ZnO precursor had been converted to a xerogel and the FLUOROCUR™ mold was removed from the substrate. FIG. 10 shows the SEM image of patterned ZnO xerogel prepared by this process. To convert ZnO to the crystalline form, the glass substrate with patterned ZnO xerogel was heated to 500° C. at a heating rate of 10° C./min and kept at 500° C. for 1 hr. The crystalline form of the calcinated ZnO was confirmed by XRD. FIG. 11 shows an SEM image of the patterned ZnO after the calcinations of Example 7.

Example 8

Figure 12:
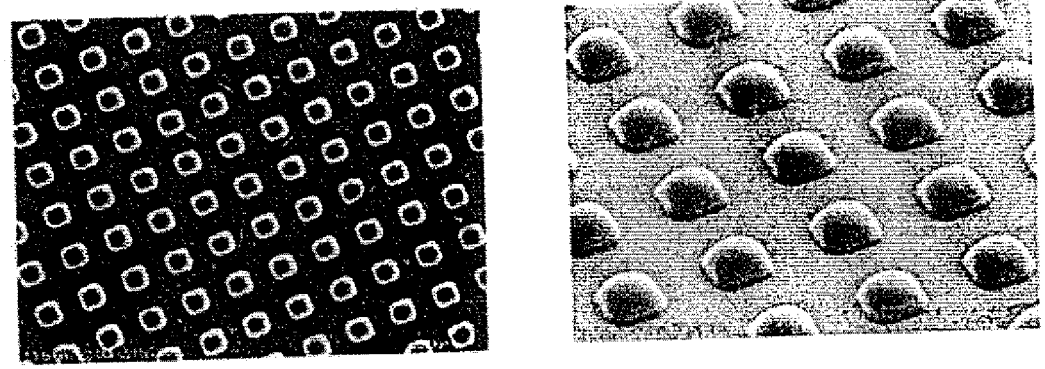
FIG. 12 shows different magnifications of crystalline form of calcinated ZnO as prepared according to Example 8 according to an embodiment of the present invention.

The sol precursor of ZnO was prepared by the following procedure. In a vial, mix 5.7 mL 2-methoxyethanol and 0.27 mL mono ethanol amine and stir the mixture to form a colorless solution. Add 1 g zinc acetate dihydrate to the solution mixture and stir at 60° C. for 30 min to form a clear solution. To make patterned ZnO, an aliquot of the sol precursor was added onto a glass substrate. A piece of FLUOROCUR™ mold with 3 micron features was put on top of the sol solution. The apparatus was put in a vice under pressure and kept at 100° C. oven for 2 hr. After cooling down, the ZnO precursor had been converted to a xerogel and the FLUOROCUR™ mold was removed from the substrate. FIG. 10 shows the SEM image of patterned ZnO xerogel prepared by this process. To convert ZnO to the crystalline form, the glass substrate with patterned ZnO xerogel was heated to 500° C. at a heating rate of 10° C./min and kept at 500° C. for 1 hr. The crystalline form of the calcinated ZnO was confirmed by XRD, as shown in FIG. 12.

Example 9

Figure 13:
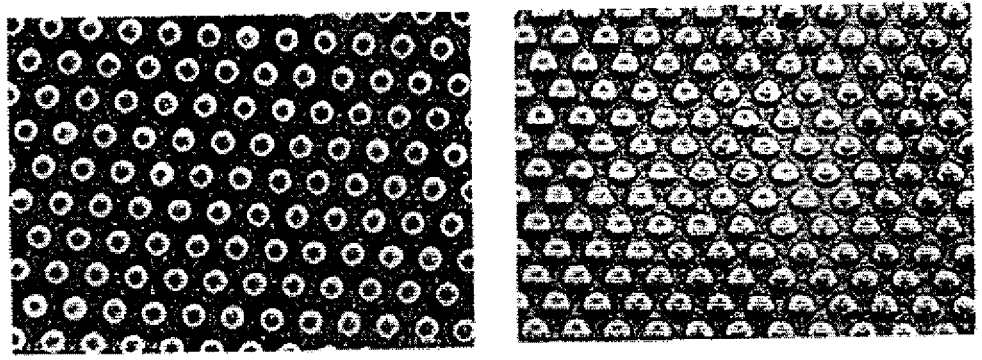
FIG. 13 shows crystalline form of calcinated ZnO at two different magnifications prepared according to Example 9 according to an embodiment of the present invention.

The sol precursor of ZnO was prepared by the following procedure. In a vial, mix 5.7 mL 2-methoxyethanol and 0.27 mL mono ethanol amine and stir the mixture to form a colorless solution. Add 1 g zinc acetate dihydrate to the solution mixture and stir at 60° C. for 30 min to form a clear solution. To make patterned ZnO, an aliquot of the sol precursor was added onto a glass substrate. A piece of FLUOROCUR™ mold with 200 nm features was put on top of the sol solution. The apparatus was put in a vice under pressure and kept at 100° C. oven for 2 hr. After cooling down, the ZnO precursor had been converted to a xerogel and the FLUOROCUR™ mold was removed from the substrate. FIG. 10 shows the SEM image of patterned ZnO xerogel prepared by this process. To convert ZnO to the crystalline form, the glass substrate with patterned ZnO xerogel was heated to 500° C. at a heating rate of 10° C./min and kept at 500° C. for 1 hr. The crystalline form of the calcinated ZnO was confirmed by XRD, as shown in FIG. 13.

Example 10

Figure 14:
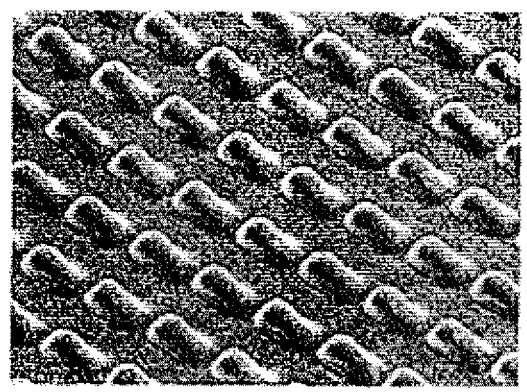
FIG. 14 shows crystalline form of calcinated In:ZnO formed according to the process detailed in Example 10 according to an embodiment of the present invention.

The sol precursor of Indium doped ZnO was prepared by the following procedure. In a vial, mix 7.19 mL 2-methoxyethanol and 0.27 mL mono ethanol amine and stir the mixture to form a colorless solution. Add 1 g zinc acetate dihydrate to the solution mixture and stir at room temperature for 1 hr. Indium chloride (3 g) was then added to the ZnO sol precursor and the mixture was stirred until it became a homogeneous solution. To make patterned In:ZnO, an aliquot of the sol precursor was added onto a glass substrate. A piece of FLUOROCUR™ mold with 2 micron features was put on top of the sol solution. The apparatus was put in a vice under pressure and kept at 100° C. oven for 2 hr. After cooling down, the In:ZnO precursor had been converted to a xerogel and the FLUOROCUR™ mold was removed from the substrate. FIG. 10 shows the SEM image of patterned In:ZnO xerogel prepared by this process. To convert In:ZnO to the crystalline form, the glass substrate with patterned In:ZnO xerogel was heated to 500° C. at a heating rate of 10° C./min and kept at 500° C. for 1 hr. The crystalline form of the calcinated In:ZnO was confirmed by XRD, as shown in FIG. 14.

Example 11

Figure 15:
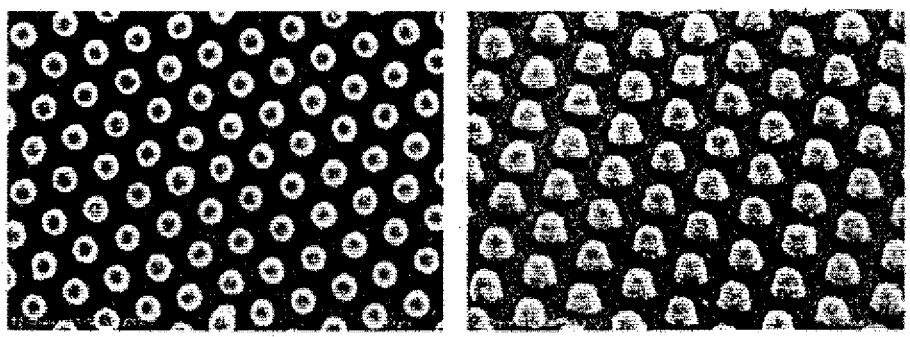
FIG. 15 shows different magnifications of crystalline form of calcinated In:ZnO prepared according to Example 11 according to an embodiment of the present invention.

The sol precursor of Indium doped ZnO was prepared by the following procedure. In a vial, mix 7.19 mL 2-methoxyethanol and 0.27 mL mono ethanol amine and stir the mixture to form a colorless solution. Add 1 g zinc acetate dihydrate to the solution mixture and stir at room temperature for 1 hr. Indium chloride (3 g) was then added to the ZnO sol precursor and the mixture was stirred until it became a homogeneous solution. To make patterned In:ZnO, an aliquot of the sol precursor was added onto a glass substrate. A piece of FLUOROCUR™ mold with 200 nm features was put on top of the sol solution. The apparatus was put in a vice under pressure and kept at 100° C. oven for 2 hr. After cooling down, the In:ZnO precursor had been converted to a xerogel and the FLUOROCUR™ mold was removed from the substrate. FIG. 10 shows the SEM image of patterned In: ZnO xerogel prepared by this process. To convert In:ZnO to the crystalline form, the glass substrate with patterned In:ZnO xerogel was heated to 500° C. at a heating rate of 10° C./min and kept at 500° C. for 1 hr. The crystalline form of the calcinated In: ZnO was confirmed by XRD, as shown in FIG. 15.

Example 12

Figure 16:
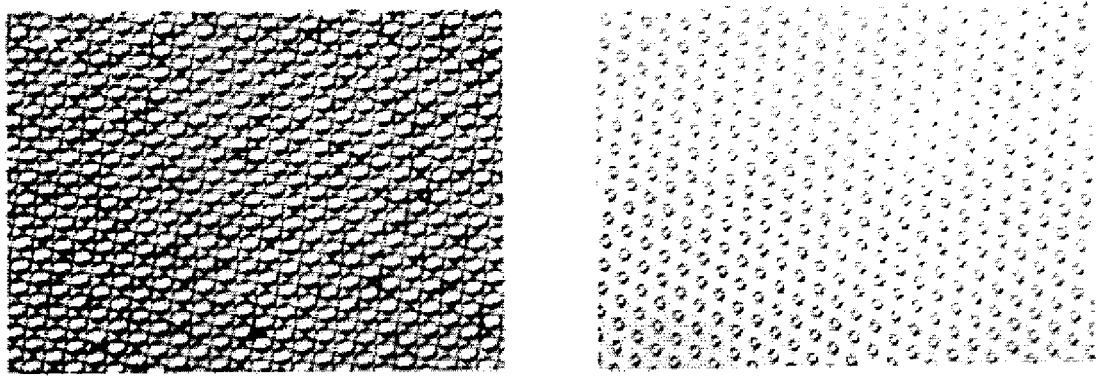
FIG. 16 shows two different magnifications of patterned ITO before and after calcinations prepared according to Example 12 according to an embodiment of the present invention.

The sol precursor of ITO was prepared by the following procedure. In vial A, add 2.05 g Indium nitrate pentahydrate, 0.15 g tin chloride pentahydrate, 3.16 g acetylacetone, and 0.009 g water and stir the mixture at 50° C. for 2 hr. In vial B, mix 0.8514 g benzoylacetone and 20 g 2-methoxyethanol and stir at room temperature for 2 hr. Then mix the solutions in vial A and B and stir at room temperature for at least 8 hr before use. To make patterned ITO, an aliquot of the sol precursor was added onto a glass substrate. A piece of FLUOROCUR™ mold with 3 micron features was put on top of the sol solution. The apparatus was put in a vice under pressure and kept at 90° C. oven for 2 hr. After cooling down, the ITO precursor had been converted to a xerogel and the FLUOROCUR™ mold was removed from the substrate. To convert ITO to the crystalline form, the glass substrate with patterned ITO was heated to 600° C. at a heating rate of 10° C./min and kept at 600° C. for 1 hr. The crystalline form of the calcinated ITO was confirmed by XRD. FIG. 16 shows SEM images of the patterned ITO fabricated from this Example before and after calcinations.

Example 13

Figure 17:
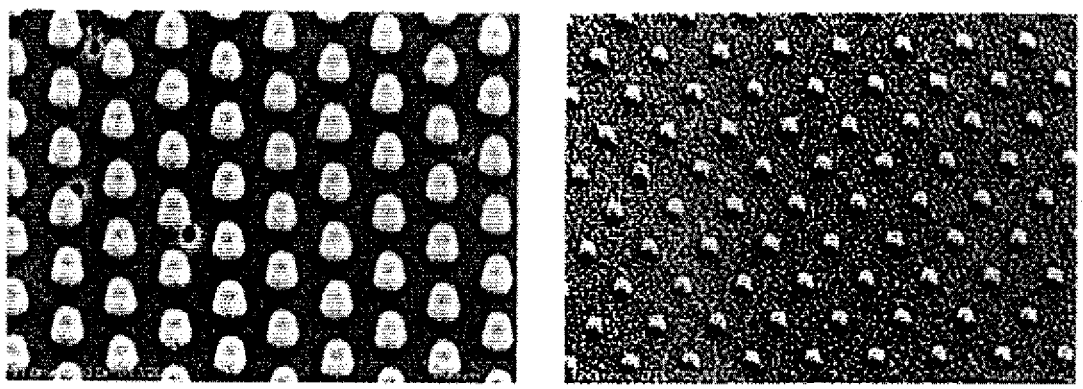
FIG. 17 shows two different magnifications of patterned ITO before and after calcinations prepared according to Example 13 according to an embodiment of the present invention.

The sol precursor of ITO was prepared by the following procedure. In vial A, add 2.05 g Indium nitrate pentahydrate, 0.15 g tin chloride pentahydrate, 3.16 g acetylacetone, and 0.009 g water and stir the mixture at 50° C. for 2 hr. In vial B, mix 0.8514 g benzoylacetone and 20 g 2-methoxyethanol and stir at room temperature for 2 hr. Then mix the solutions in vial A and B and stir at room temperature for at least 8 hr before use. To make patterned ITO, an aliquot of the sol precursor was added onto a glass substrate. A piece of FLUOROCUR™ mold with 200 nm features was put on top of the sol solution. The apparatus was put in a vice under pressure and kept at 90° C. oven for 2 hr. After cooling down, the ITO precursor had been converted to a xerogel and the FLUOROCUR™ mold was removed from the substrate. To convert ITO to the crystalline form, the glass substrate with patterned ITO was heated to 600° C. at a heating rate of 10° C./min and kept at 600° C. for 1 hr. The crystalline form of the calcinated ITO was confirmed by XRD. FIG. 17 shows SEM images of the patterned ITO fabricated according to this Example before and after calcinations.

Example 14

Figure 18:
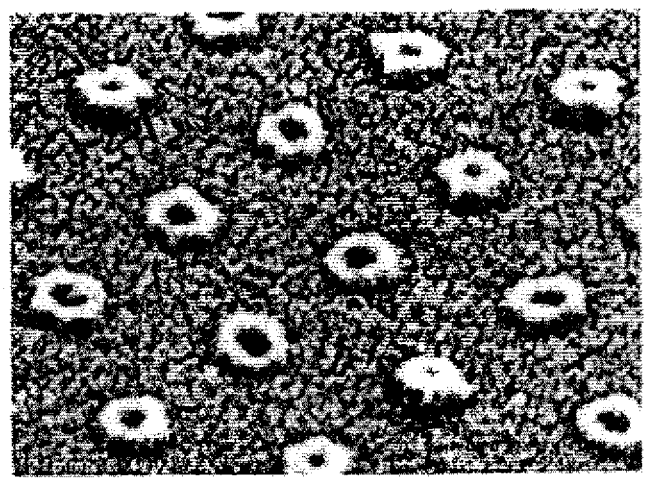
FIG. 18 shows anatase $TiO_2$ nano-rods from hollow structures with a outer diameter of about 200 nm, an inner diameter of 50-100, and a height of 50-80 nm, where the anatase $TiO_2$ nano-rods is formed from the processes of Example 14 according to an embodiment of the present invention.

An aliquot of $TiO_2$ nano-rod (anatase form) dispersion in chloroform was added onto a glass substrate. A piece of FLUOROCUR™ mold with 200 nm by 200 nm features was put on top of the dispersion. The apparatus was put in a vice under pressure and kept at room temperature for 1 hr. After solvent evaporation, the FLUOROCUR™ mold was removed from the substrate and the anatase $TiO_2$ nano-rods from hollow structures, shown by the SEM in FIG. 18, with a outer diameter of about 200 nm, an inner diameter of 50-100, and a height of 50-80 nm.

Example 15

Figure 19:
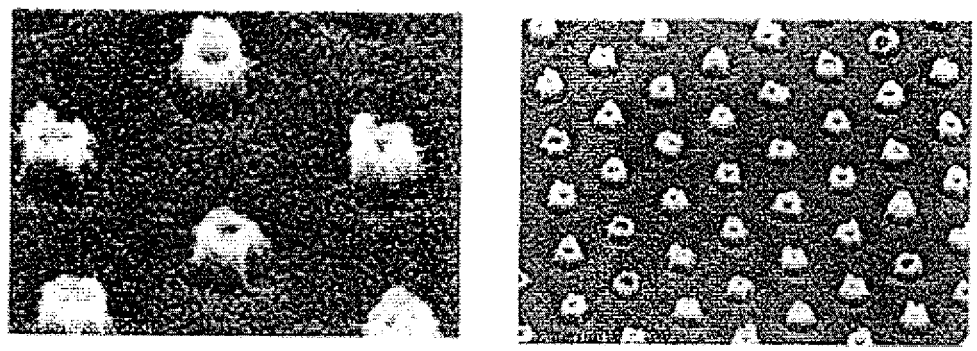
FIG. 19 shows anatase $TiO_2$ nano-rods from hollow structures with a outer diameter of about 200 nm, an inner diameter of 50-100, and a height of 150-200 nm, wherein the structures are formed in accord with Example 15 according to an embodiment of the present invention.

An aliquot of $TiO_2$ nano-rod (anatase form) dispersion in chloroform was added onto a glass substrate. A piece of FLUOROCUR™ mold with 200 nm by 600 nm features was put on top of the dispersion. The apparatus was put in a vice under pressure and kept at room temperature for 1 hr. After solvent evaporation, the FLUOROCUR™ mold was removed from the substrate and the anatase TiO$_2$ nano-rods from hollow structures, shown by the SEM of FIG. 19, with a outer diameter of about 200 nm, an inner diameter of 50-100, and a height of 150-200 nm.

Example 16

Figure 20:
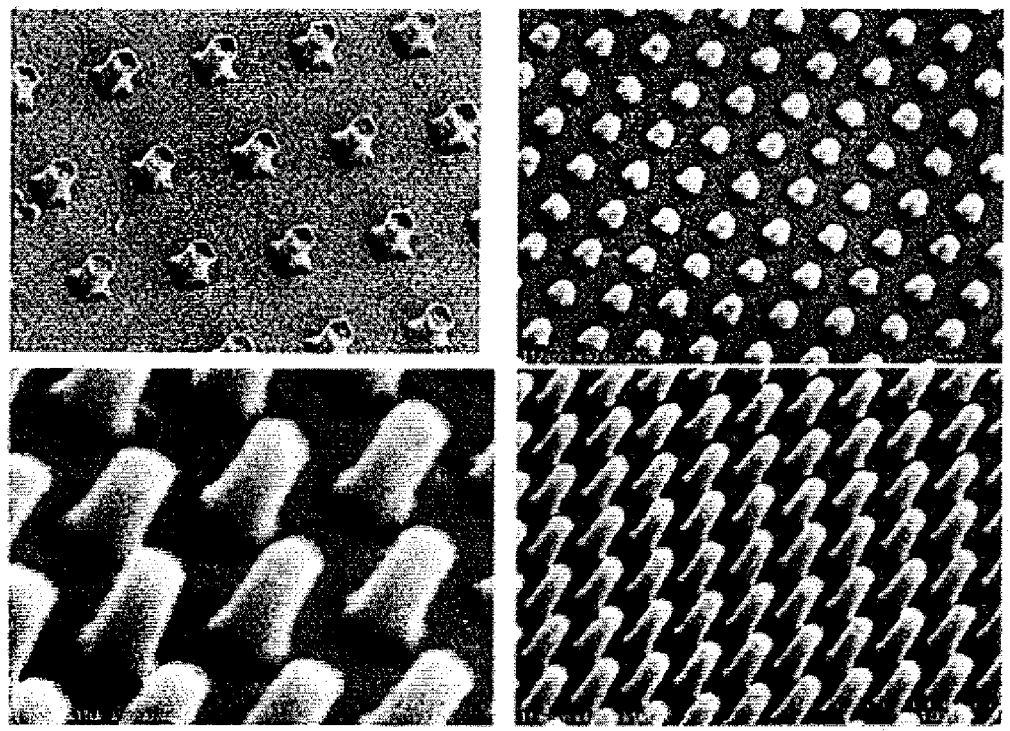
FIG. 20 shows SEM images of patterned P3HT by such solution process disclosed in Example 16 according to an embodiment of the present invention.

10.8 mg P3HT was added into 0.6 mL chloroform to form a homogeneous solution. An aliquot of the P3HT solution was added onto a glass or PET substrate. A piece of FLUOROCUR™ mold with 2 micron, 200 nm by 200 nm or 200 nm by 600 nm features was put on top of the solution. The apparatus was put in a vice under pressure and kept at room temperature for 1 hr. After solvent evaporation, the FLUOROCUR™ mold was removed from the substrate and patterned P3HT was formed on the substrate. FIG. 20 shows an SEM image of the patterned P3HT by such solution process of this Example.

Example 17

Figure 21:
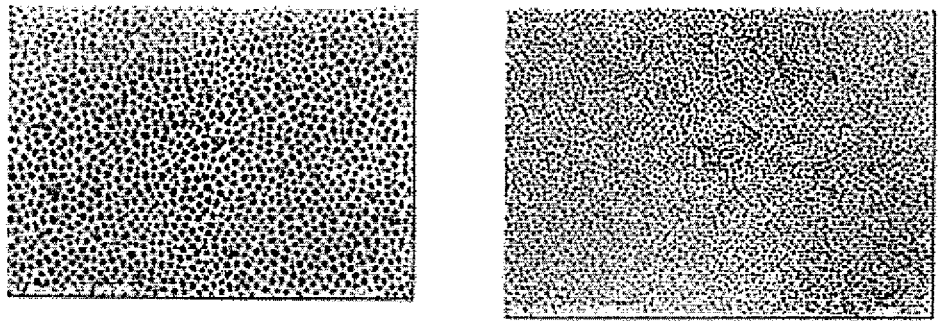
FIG. 21 shows SEM images of patterned P3HT by such solution process as described in Example 17 according to an embodiment of the present invention.

10.8 mg P3HT was added into 0.6 mL chloroform to form a homogeneous solution. An aliquot of the P3HT solution was added onto a glass or PET substrate. A piece of FLUOROCUR™ mold made from a AAO template with a pore diameter of 70 nm or 40 nm was put on top of the solution. The apparatus was put in a vice under pressure and kept at room temperature for 1 hr. After solvent evaporation, the FLUOROCUR™ mold was removed from the substrate and patterned P3HT was formed on the substrate. FIG. 21 shows an SEM image of the patterned P3HT by such solution process of this Example.

Example 18

Figure 22:
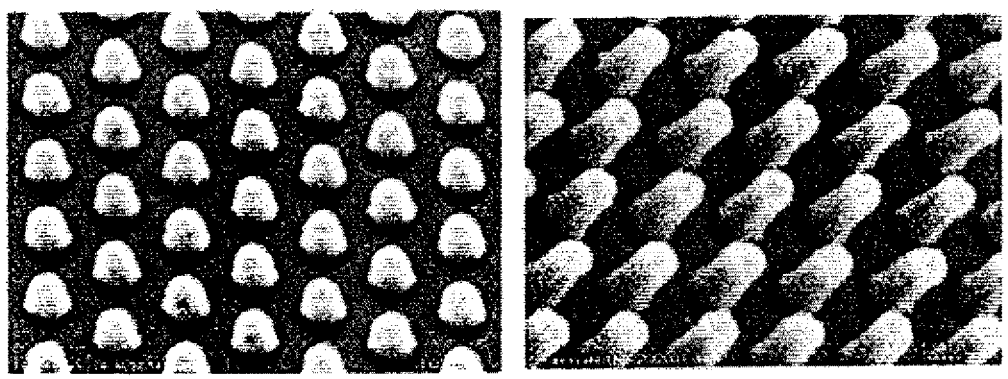
FIG. 22 shows SEM images at different magnifications of thermally patterned P3HT on a glass or PET substrate, where the structures are formed in accord with the methods of Example 18 according to an embodiment of the present invention.

12 mg P3HT was dissolved in 0.6 mL chloroform to form a homogeneous solution. A thin layer of P3HT on glass or a PET substrate was formed by spreading a uniform layer of P3HT solution using Meyer rod and wait for the solvent to evaporate. A piece of FLUOROCUR™ mold with 200 nm by 200 nm or 200 nm by 600 nm features was brought into contact with the P3HT layer on glass or PET substrate and kept under pressure in a vice. The whole apparatus was kept in 200° C. oven for 15 min. After cooling down, the FLUOROCUR™ mold was removed and patterned P3HT was formed on the substrate. FIG. 22 shows SEM images of the thermally patterned P3HT on a glass or PET substrate of this Example.

Example 19

Figure 23:
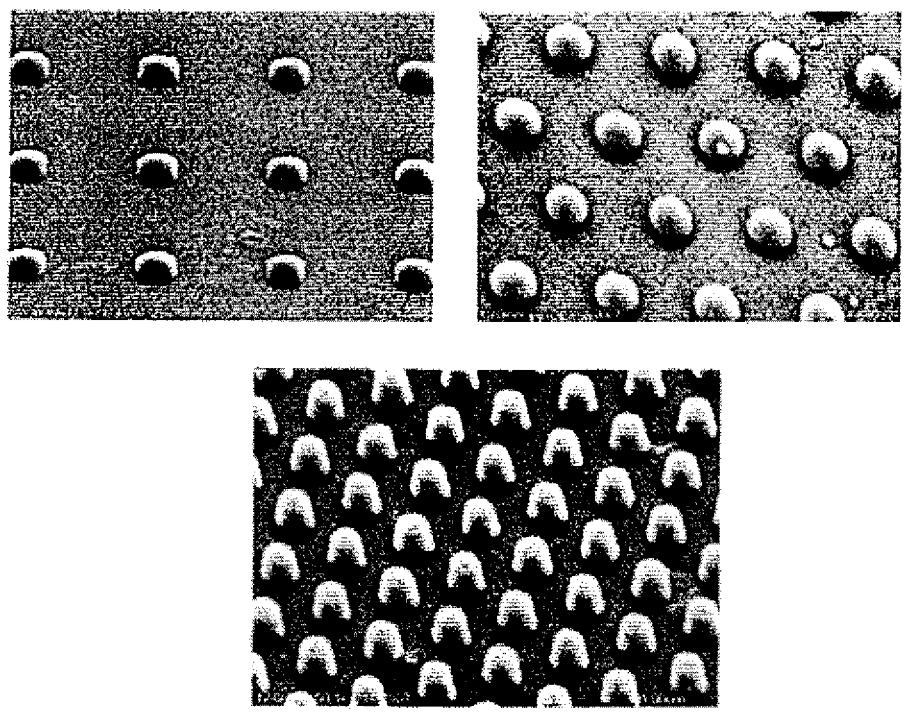
FIG. 23 shows multiple SEM images of patterned PCBM by such solution process as those described in Example 19 according to an embodiment of the present invention.

22 mg PCBM was added into 0.65 mL chloroform to form a homogeneous solution. An aliquot of the PCBM solution was added onto a glass or PET substrate. A piece of FLUOROCUR™ mold with 2 micron, 200 nm by 200 nm or 200 nm by 600 nm features was put on top of the solution. The apparatus was put in a vice under pressure and kept at room temperature for 1 hr. After solvent evaporation, the FLUOROCUR™ mold was removed from the substrate and patterned PCBM was formed on the substrate. FIG. 23 shows SEM images of the patterned PCBM by such solution process of this Example.

Example 20

PCBM-P3HT Active Layer 22 mg PCBM was added into 0.65 mL chloroform to form a homogeneous solution. An aliquot of the PCBM solution was added onto a glass or PET substrate. A piece of FLUOROCUR™ mold with 200 nm by 600 nm features was put on top of the solution. The apparatus was put in a vice under pressure and kept at room temperature for 1 hr. After solvent evaporation, the FLUOROCUR™ mold was removed from the substrate and patterned PCBM was formed on the substrate.

Figure 24:
FIG. 24 shows a cross-section of interface between a PCBM-P3HT active layer network, as fabricated according to the process and procedure of Example 20 according to an embodiment of the present invention.

11 mg P3HT was dissolved in 0.6 mL chloroform to form a homogeneous solution. A thin layer of P3HT on a PET substrate was formed by spreading a uniform layer of P3HT solution using Meyer rod and wait for the solvent to evaporate. The P3HT covered PET substrate was brought into contact with the patterned PCBM and kept under pressure in a vice. The whole apparatus was kept in 200° C. oven for 15 min. After cooling down, the PET substrate was removed and the patterned PCBM and P3HT form inter-digitized network. FIG. 24 shows the cross-sectional SEM image of the network fabricated from this Example.

That which is claimed is:

1. A method for harvesting micro- and/or nano-particles, comprising:
    a) contacting a harvesting layer and one or more of the micro- and/or nano-particles, wherein the harvesting layer is associated with a surface of the one or more micro- and/or nano-particles, wherein prior to said contacting, each of the one or more micro- and/or nano-particles resides in a discrete recess of a polymer mold, and wherein the harvesting layer has an affinity for the particles greater than the affinity of the particles for the polymer mold;
    b) dissociating the harvesting layer from the polymer mold, wherein the one or more micro- and/or nano-particles are removed from the recess of the polymer mold to prepare harvested particles, wherein the harvested particles are in communication with the harvesting layer;
    wherein the harvested particles are a plurality of monodisperse particles.

2. The method of claim 1, further comprising:
    c) dissociating the harvested particles from the harvesting layer.

3. The method of claim 2, wherein dissociating the harvested particles comprises scraping the particles under dry conditions.

4. The method of claim 2, wherein dissociating the harvested particles comprises dissolving at least a portion of the harvesting layer.

5. The method of claim 1, wherein the surface energy of the harvesting layer is greater than the surface energy of the polymer mold.

6. The method of claim 1, wherein the harvesting layer comprises a surface that has a surface energy greater than the surface energy of the polymer mold.

7. The method of claim 1, wherein the harvesting layer is a sheet or a film.

8. The method of claim 1, wherein the harvesting layer comprises a material selected from the group consisting of a carbohydrate, an epoxy, a wax, polyvinyl alcohol, polyvinyl pyrrolidone, polybutyl acrylate, a polycyano acrylate and polymethyl methacrylate or combinations thereof.

9. The method of claim 1, wherein the harvested particles are in an array, wherein the distance between each particle is between about 1 nm and about 100 nm.

10. The method of claim 9, wherein the distance is between about 5 nm and about 20 nm.

11. The method of claim 1, wherein at least one of the harvested particles is a nanoparticle having a size between about 1 nm about 200 nm.

12. The method of claim 1, wherein at least one of the harvested particles is a nanoparticle having a size between about 1 nm about 50 nm.

13. The method of claim 1, wherein at least one of the harvested particles is a nanoparticle having a size between about 1 nm about 20 nm.

\* \* \* \* \*